(12) United States Patent
Matsufusa

(10) Patent No.: US 6,541,337 B2
(45) Date of Patent: Apr. 1, 2003

(54) SEMICONDUCTOR MEMORY DEVICE AND MANUFACTURING METHOD THEREOF

(75) Inventor: Jiro Matsufusa, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 16 days.

(21) Appl. No.: 09/816,399

(22) Filed: Mar. 26, 2001

(65) Prior Publication Data

US 2001/0020710 A1 Sep. 13, 2001

Related U.S. Application Data

(62) Division of application No. 09/428,281, filed on Oct. 27, 1999.

(30) Foreign Application Priority Data

May 12, 1999 (JP) ............................................. 11-131749

(51) Int. Cl.[7] .......................................... H01L 21/8242
(52) U.S. Cl. ..................... 438/255; 438/398; 257/309
(58) Field of Search .................................. 438/239, 250, 438/251, 253, 254, 255, 396, 397, 398, 704, 705, 745, 756, 757, 481, 482, 960, 964; 257/309

(56) References Cited

U.S. PATENT DOCUMENTS

| 5,279,983 | A | | 1/1994 | Ahn |
|---|---|---|---|---|
| 5,386,382 | A | | 1/1995 | Ahn |
| 6,188,097 | B1 | * | 2/2001 | Derderian et al. .......... 257/306 |
| 6,265,263 | B1 | * | 7/2001 | Wu ............................ 438/255 |
| 6,303,430 | B1 | * | 10/2001 | Jenq ........................... 438/253 |
| 6,399,982 | B1 | * | 6/2002 | Derderian et al. .......... 257/309 |

FOREIGN PATENT DOCUMENTS

| GB | 2 296 380 | 6/1996 |
|---|---|---|
| JP | 7-7084 | 1/1995 |
| JP | 8-255880 | 10/1996 |
| JP | 10-163441 | 6/1998 |

* cited by examiner

*Primary Examiner*—Olik Chaudhuri
*Assistant Examiner*—Ginette Peralta
(74) *Attorney, Agent, or Firm*—McDermott, Will & Emery

(57) ABSTRACT

A memory cell has a cylindrical electrode having a porous cylindrical portion, and insulating layers for making less steep the height of cylindrical electrode are provided in the peripheral circuit region. Thus a semiconductor memory device and manufacturing method thereof can be provided in which the step between the memory cell array region and the peripheral circuit region can be made less steep by a smaller number of manufacturing steps.

7 Claims, 40 Drawing Sheets

PROGRESS OF SURFACE ROUGHENING

GENERATION OF NUCLEI

GROWTH, SURFACE ROUGHENING

OPENING OF PORES

EXCESSIVE GROWTH RESULTING IN
CONNECTION OF NUCLEI

SEMICONDUCTOR MEMORY DEVICE AND MANUFACTURING METHOD THEREOF

This application is a Divisional of application Ser. No. 09/428,281 filed Oct. 27, 1999 now allowed.

BACKGROUND OF THE INVENTION

1. Field of the Invention

The present invention relates to a semiconductor memory device and manufacturing method thereof. More particularly, the present invention relates to a semiconductor memory device having a memory cell array region and a peripheral circuit region, and to a manufacturing method thereof.

2. Description of the Background Art

Recently, because of widespread use of information equipments including computers, the demand for semiconductor memory devices has been rapidly increasing. As to the function, a memory device having large scale storage region and capable of high speed operation has been required. Accordingly, technical development has been made to attain higher degree of integration, high speed response and high reliability of the semiconductor memory device.

A DRAM (Dynamic Random Access Memory) has been generally known as one of the semiconductor memory devices which allows random input/output of memory information. The DRAM includes a memory array 51 which is a storage region for storing a large number of pieces of memory information, and a peripheral circuitry controlling the memory cells in the memory cell array 51 for external input/output, as shown in FIG. 45.

The peripheral circuitry mainly includes a row and column address buffer 52, a row decoder 53, a column decoder 54, a sense refresh amplifier 55, a data in buffer 56, a data out buffer 57 and a clock generator 58.

On a semiconductor chip of the DRAM having such a structure, memory cell array 51 occupies a large area. A plurality of memory cells each for storing unit memory information are formed arranged in a matrix. The memory cell generally consists of one MOS (Metal Oxide Semiconductor) transistor and one capacitor connected thereto, and is widely known as a one transistor, one capacitor type memory cell. The memory cell having such a simple structure facilitates improvement of the degree of integration of the memory cell array, and therefore it has been widely used for DRAMs having large capacity.

In such a DRAM, the conventional structure at an interface between the memory cell array region and the peripheral circuit region is as shown in FIG. 46, for example.

Referring to FIG. 46, a capacitor 105 constituting the memory cell has a cylindrical lower electrode (storage node) 101, and an upper electrode (cell plate) 104 opposing to the lower electrode 101 with a capacitor dielectric film 103 interposed.

The lower electrode 101 is formed on an insulating layer 116, and is electrically connected to a source/drain region (not shown) of the MOS transistor through a conductive layer 102 in a contact hole 118. Further, an insulating layer 106 is formed to extend both to the memory cell array region and the peripheral circuit region, covering capacitor 105.

In the structure of the conventional semiconductor memory device shown in FIG. 46, when the degree of integration is increased, a step or level difference $S_2$ between the memory cell array region and the peripheral circuit region increases, degrading process margin of the subsequent manufacturing steps. This problem will be described in detail in the following.

When higher degree of integration of the DRAM is promoted, the memory cell size is inevitably made smaller. As the memory cell size is reduced, two-dimensional area of occupation of the substrate is reduced accordingly. Therefore, the amount of charges stored in the capacitor (amount of charges stored in 1 bit of memory cell) decreases, so that the operation of the DRAM as a storage region becomes unstable, lowering reliability.

In order to prevent the unstable operation of the DRAM, it is necessary to increase the capacitor capacitance within the limited two-dimensional area of occupation. As means to increase capacitor capacitance, approaches such as ①  marking thinner the capacitor dielectric film, ② enlargement of opposing area of the capacitor and ③ increase in dielectric constant of the capacitor dielectric film have been studied.

The approach ①, that is, making thinner the capacitor dielectric film has already reached the limit as long as a silicon oxide film is generally used as the capacitor dielectric film. The approach ③, that is, increase in dielectric constant of the capacitor dielectric film has various problems unsolved, as it is necessary to employ a material of high dielectric constant as the capacitor dielectric film. Therefore, the approach ②, that is, enlargement of the opposing area of the capacitor has been widely adopted as the simplest method.

In approach ②, the capacitor capacitance can be increased by providing a cylindrical portion at lower electrode 101 and making higher the cylindrical portion, as shown in FIG. 46.

When the height of the cylindrical portion of lower electrode 101 is made higher, the step $S_2$ between the memory cell array region and the peripheral circuit region becomes higher. The higher the step $S_2$, the more residue will be left at the portion of the step $S_2$ at the time of patterning the conductive layer on insulating layer 106, possibly resulting in a failure such as a short-circuit of the conductive layer because of this residue. Thus, the larger step $S_2$ decreases process margin of the subsequent manufacturing steps.

SUMMARY OF THE INVENTION

An object of the present invention is to provide a semiconductor memory device and manufacturing method thereof which can reduce the step between the memory cell array region and the peripheral circuit region in a small number of manufacturing steps.

The semiconductor memory device in accordance with the present invention, which has a memory cell array region including a plurality of memory cells and a peripheral circuit region including elements controlling the memory cells, includes a cylindrical electrode and an insulating layer. The cylindrical electrode is contained in the memory cell, and has a porous cylindrical portion. The insulating layer is formed only in the peripheral circuit region to make less steep the step resulting from the provision of the cylindrical electrode.

In the semiconductor memory device in accordance with the present invention, the insulating layer is provided only in the peripheral circuit region, and therefore the step between the memory cell array region and the peripheral circuit region can be made less steep by the thickness of the insulating layer. Accordingly, degradation of the process margin in the subsequent manufacturing steps can be prevented.

In the semiconductor memory device described above, preferably, the insulating layer has an end surface positioned at an interface between the memory cell array region and the peripheral circuit region, with the end surface arranged facing an outer peripheral surface of the cylindrical electrode.

By such an arrangement of the insulating layer, the step generated by the cylindrical electrode can be made less steep.

In the semiconductor memory device described above, preferably, a first silicon nitride film is further provided, formed in the memory cell array region to be in contact with a lower surface of the cylindrical electrode.

Therefore, the first silicon nitride film acts as an etching stopper, facilitating control of etching.

In the above described semiconductor memory device, preferably, a semiconductor substrate having a conductive region on its main surface, a second insulating layer having a contact hole formed on the main surface and reaching the conductive region, and a second silicon nitride film formed in contact with a side surface of the contact hole are further provided. The cylindrical electrode is electrically connected to the conductive region through the contact hole.

Accordingly, good electrical connection can be established between the cylindrical electrode and the conductive region.

In the above described semiconductor memory device, preferably, another electrode is further provided, which opposes to the cylindrical electrode with a dielectric film interposed to form a capacitor together with the cylindrical electrode.

Thus, a capacitor constituting a memory cell can be obtained.

In the above described semiconductor memory device, preferably, the conductive region is a source/drain region of an insulated gate type field effect transistor.

Thus, an insulated gate type field effect transistor as a memory transistor constituting the memory cell can be obtained.

The method of manufacturing a semiconductor memory device in accordance with the present invention is for manufacturing a semiconductor device having a memory cell array region including a plurality of memory cells and a peripheral circuit region including elements for controlling the memory cells, including the following steps.

First, an insulating layer having an opening in the memory cell array region is formed both in the memory cell array region and the peripheral circuit region. A conductive layer having a porous cylindrical portion along an inner wall surface of the opening is formed. An etchant is introduced through the pores of the conductive layer from the inner peripheral region to the outer peripheral region of the cylindrical portion, so that an insulating layer positioned on an outer peripheral side of the cylindrical portion is removed by etching.

In the method of manufacturing a semiconductor memory device in accordance with the present invention, the etchant is introduced from the inner peripheral region to the outer peripheral region of the cylindrical portion, whereby the insulating layer on the side of the outer periphery of the cylindrical portion is removed. In other words, the insulating layer on the side of the outer periphery of the cylindrical portion is removed by etching in the lateral direction from the inner to the outer peripheral side. Therefore, what is necessary is to etch only by the desired width, of the insulating layer on the side of the outer periphery of the cylindrical portion, and etching by the vertical height of the cylindrical portion is unnecessary. Therefore, reduction in film thickness in the vertical direction resulting from the etching can be reduced. Therefore, it is unnecessary to provide a mask on the peripheral circuit region at the time of etching, and etching in self-alignment manner is possible.

In the above described manufacturing method, preferably, the removal by etching is effected by isotropic etching.

Accordingly, it is possible to introduce the etchant from the inner peripheral region to the outer peripheral region of the cylindrical portion.

In the above described manufacturing method, preferably, a step is further provided in which another electrode is formed to oppose both to the inner and outer peripheral surfaces of the cylindrical portion with the dielectric film interposed.

Thus, a capacitor constituting a memory cell can be manufactured.

In the above described manufacturing method, preferably, the step of forming the conductive layer having porous cylindrical portion includes the asteps of forming a porous conductive layer on an inner wall surface of the opening and on an upper surface of the insulating layer, forming a resist only at the bottom portion of the opening, and, by anisotropically etching the conductive layer with the resist left, removing the conductive layer on the upper surface of the insulating layer and leaving the conductive layer in the opening.

Thus a conductive layer having a porous cylindrical portion can be formed.

In the above described manufacturing method, preferably, the step of forming the resist only at the bottom portion of the opening includes the steps of applying a positive resist on an entire surface, exposing a relatively shallow portion to such an extent that enables removal by development from an upper surface of the resist and exposing a relatively deep portion to such an extent that does not allow removal by development, and developing the exposed resist.

Thus, the resist can be left only at the bottom portion of the opening, using a positive resist.

In the above described manufacturing method, preferably, the step of forming the resist only at the bottom portion of the opening includes the step of applying the resist on an entire surface, and developing the resist to remove a relatively shallow portion only and to leave relatively deep portion, from an upper surface of the resist.

Thus, it becomes possible to leave the resist only on the bottom portion of the opening using either a negative or positive resist.

In the above described manufacturing method, preferably, the step of forming a porous conductive layer includes, after the conductive layer is formed, the step of performing heat treatment or making the layer porous and rough, under the condition of a temperature of 600° C. to 620° C. for 1 to 5 minutes.

Thus, an electrode having a porous cylindrical portion can be formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the figures.

First, the structure in the memory cell array region will be described.

Figure 1:
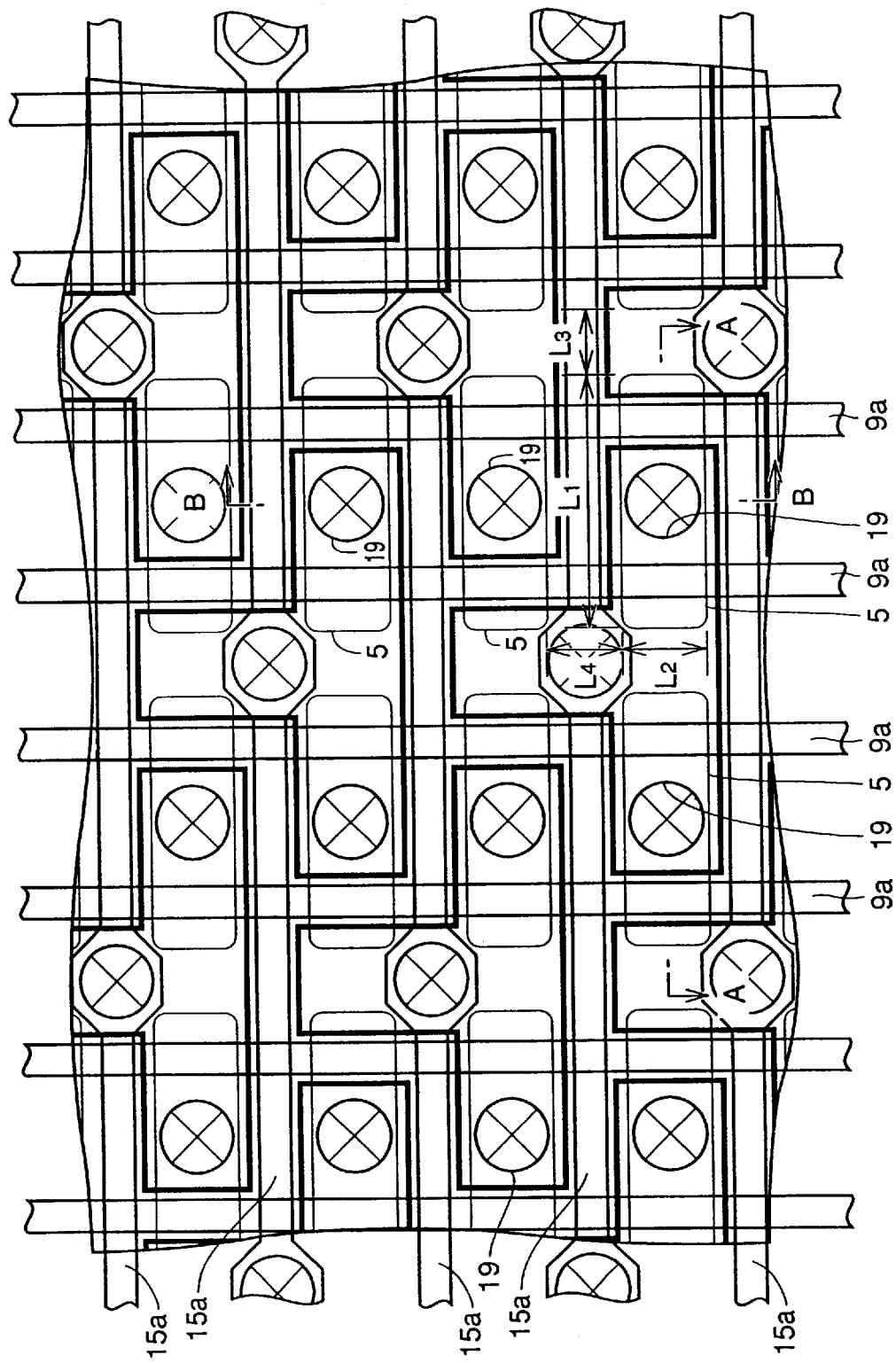
FIG. 1 is a schematic plan view representing a structure of a memory cell array region in the semiconductor memory device in accordance with a first embodiment of the present invention.

First, referring to FIG. 1, in the memory cell array region, a plurality of word lines 9a and a plurality of bit lines 15a orthogonally intersecting word lines 9a are arranged, and at each intersection between the word lines 9a and bit lines 15a, a memory cell is provided.

Figure 2:
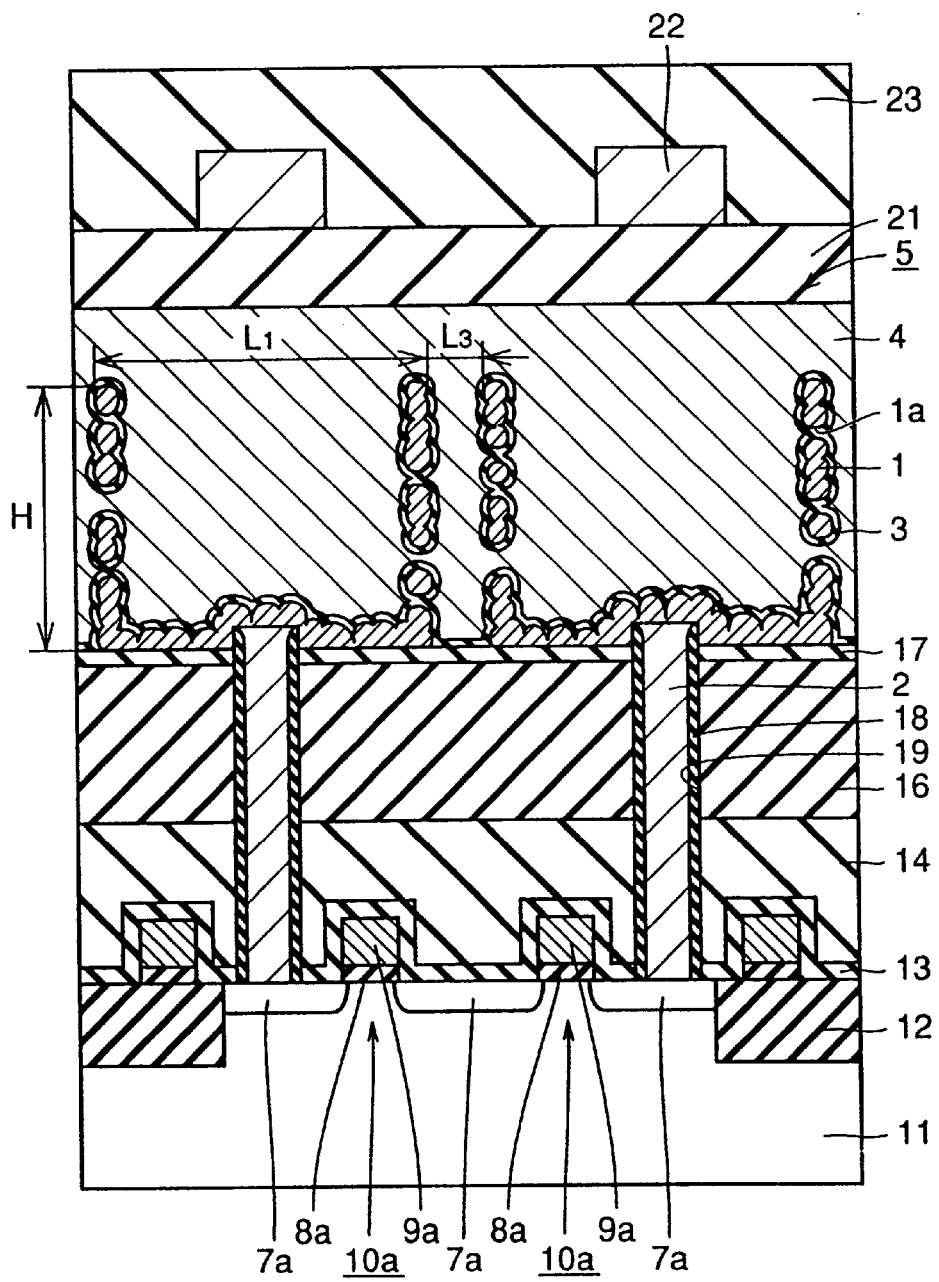
FIG. 2 is a schematic cross section taken along the line A—A of FIG. 1.
Figure 3:
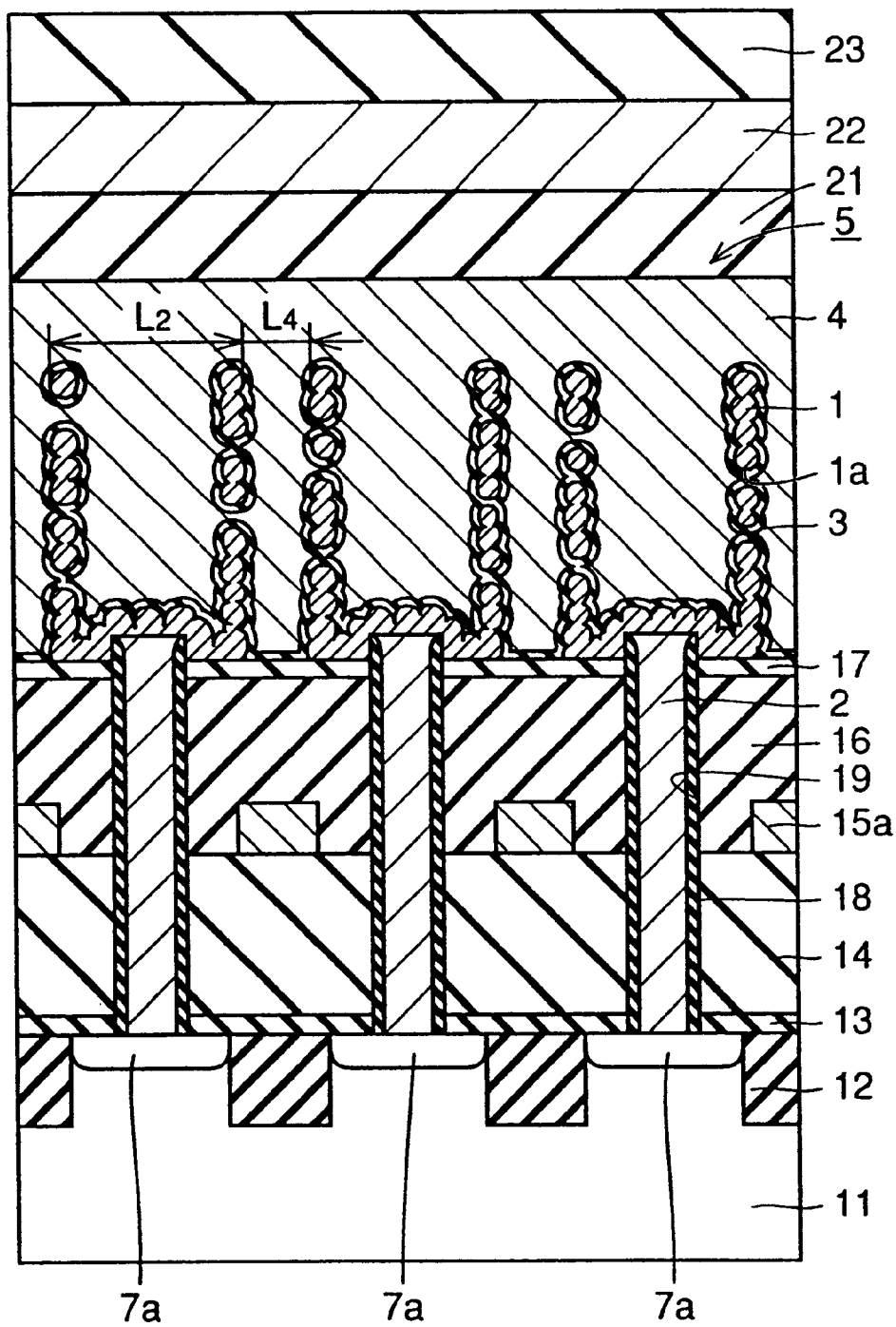
FIG. 3 is a schematic cross section taken along the line B—B of FIG. 1

Referring to FIGS. 2 and 3, the memory cell is of one transistor one capacitor type, including an MOS transistor 10a and a capacitor 5.

MOS transistor 10a is formed on a surface isolated by trench isolation 12 of silicon substrate 11. MOS transistor 10a includes a pair of source/drain regions 7a, a gate insulating layer 8a and a gate electrode layer (word line) 9a. The pair of source/drain regions 7a are formed at the surface of silicon substrate 11, and gate electrode layer 9a is formed on a region between the pair of source/drain regions 7a with gate insulating layer 8a interposed.

A silicon nitride film 13 and an interlayer insulating layer 14, which is formed of a silicon oxide film, for example, are formed to cover MOS transistor 10a. On interlayer insulating layer 14, a bit line 15a is formed, which bit line 15a is electrically connected to source/drain region 7a of MOS transistor 10a. An interlayer insulating layer 16 formed of a silicon oxide film, for example, and a silicon nitride film 17 are formed to cover bit line 15a.

In interlayer insulating layers 14 and 16 and silicon nitride films 13 and 17, a contact hole 19 is formed, and on an inner wall surface of contact hole 19, a sidewall insulating layer 18 of a silicon nitride film is formed. Contact hole 19 is filled with a plug layer 2. Silicon nitride film 18 and plug layer 2 protrude upward from the upper surface of silicon nitride film 17.

Figure 4:
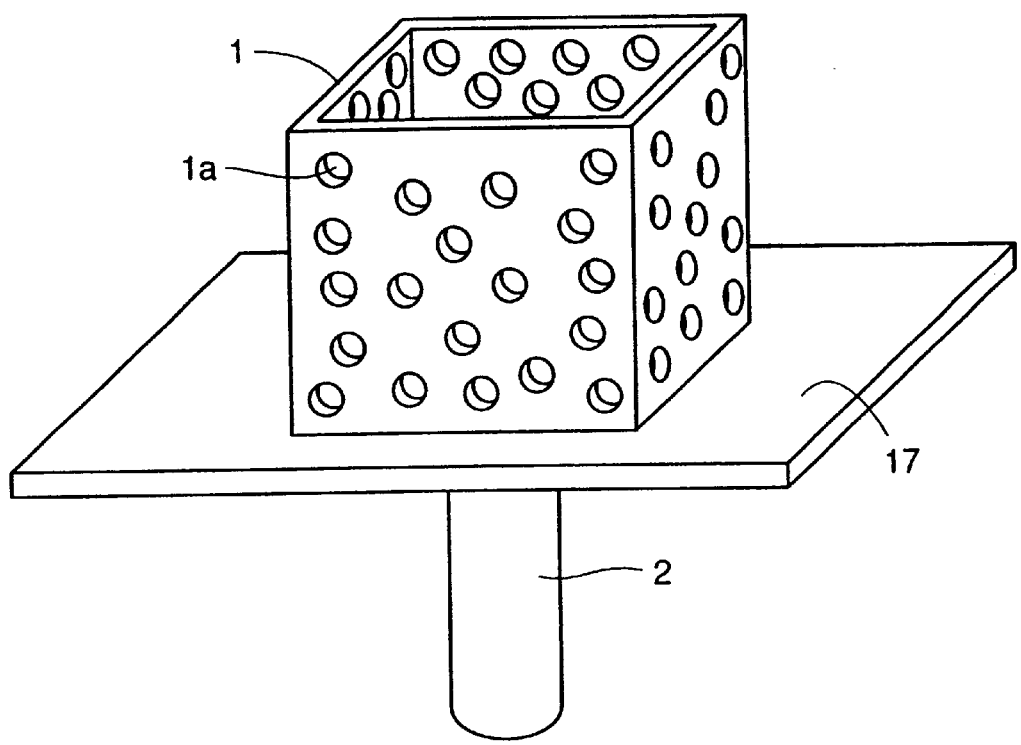
FIG. 4 is a perspective view schematically showing a structure of a lower electrode of the semiconductor memory device in accordance with an embodiment of the present invention.

A capacitor 5 is formed on silicon nitride film 17. Capacitor 5 has a lower electrode 1, a capacitor dielectric film 3 and an upper electrode 4. Lower electrode 1 includes a plurality of pores 1a and a roughened surface, as shown in FIG. 4. Further, lower electrode 1 is electrically connected to source/drain region 7a of MOS transistor 10a through plug layer 2, and is in contact with an upper surface of silicon nitride film 17. Upper electrode 4 opposes to lower electrode 1 with capacitor dielectric film 3 interposed.

As interlayer insulating layer 21 of silicon oxide film, for example, is formed to cover capacitor 5. An interconnection layer 22 is formed on interlayer insulating layer 21, and an interlayer insulating layer 23 of silicon oxide film, for example, is formed to cover interconnection layer 22.

In FIGS. 1 to 3, dimensions $L_1$, $L_2$ of one lower electrode 1 are 0.86 $\mu$m and 0.36 $\mu$m, and the height H is 0.2 $\mu$m, for example. The dimensions $L_3$ and $L_4$ between adjacent lower electrodes 1 are both 0.1 $\mu$m, for example.

The structure of the peripheral circuit region will be described in the following.

Figure 5:
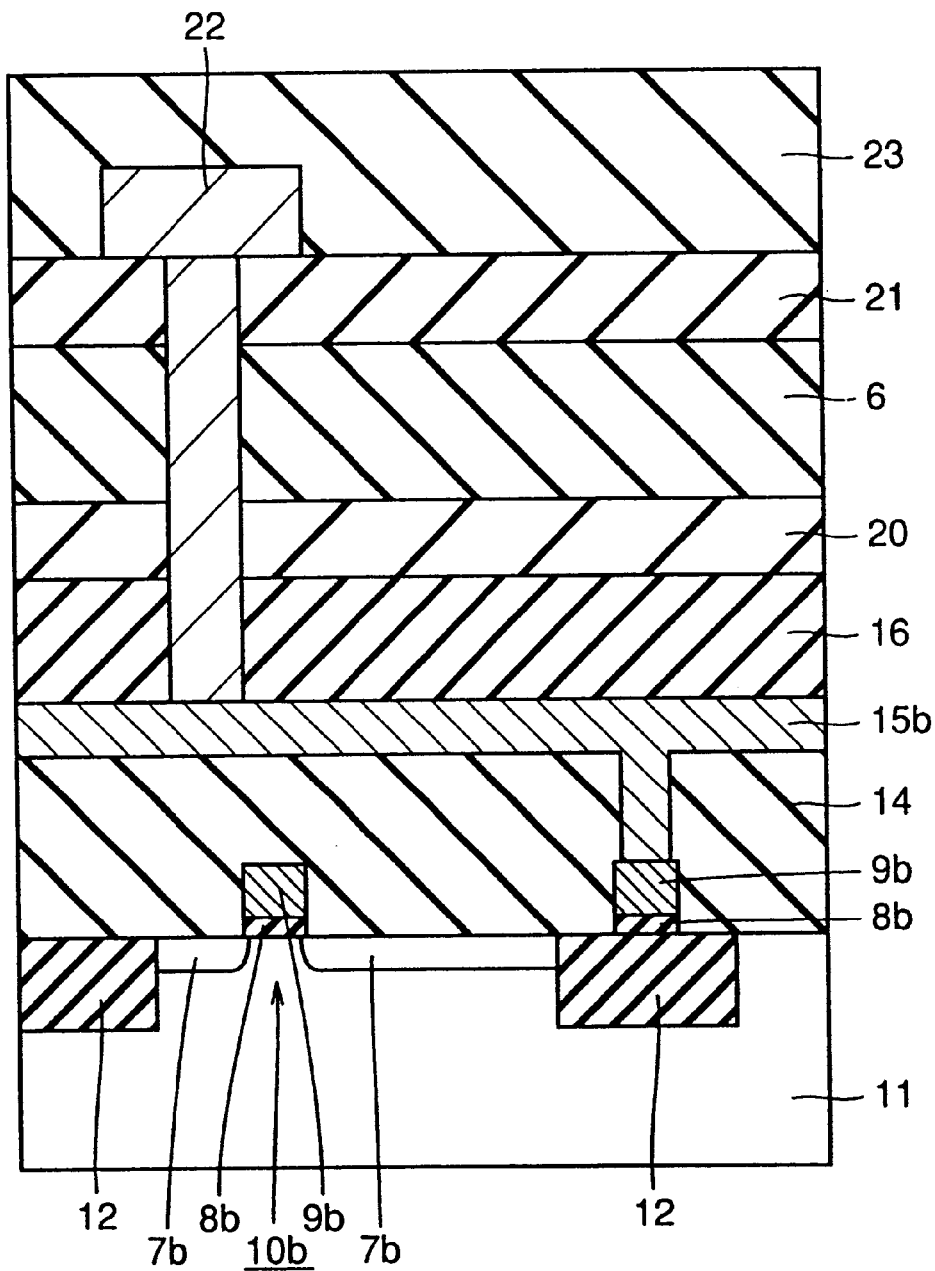
FIG. 5 is a schematic cross section of a peripheral circuit region of the semiconductor memory device in accordance with an embodiment of the present invention.

Referring to FIG. 5, in the peripheral circuit region, elements for controlling the memory cells and the like are formed, which elements include, for example, an MOS transistor 10b.

MOS transistor 10b is formed at a surface isolated by trench isolation 12 of silicon substrate 11. MOS transistor 10b has a pair of source/drain regions 7b and a gate electrode layer 9b formed on a region between the pair of source/drain regions 7b with a gate insulating layer 8b interposed. An interlayer insulating layer 14 is formed to cover MOS transistor 10b, an interconnection layer 15b is formed on interlayer insulating layer 14, and an interlayer insulating layer 16 is formed to cover interconnection layer 15b.

On interlayer insulating layer 16, insulating layers 20 and 6 of silicon oxide film, for example, to make less steep the step resulting film the lower electrode 1 are formed stacked, only in the peripheral circuit region. On insulating layer 6, an interlayer insulating layer 21 is formed. On interlayer insulating layer 21, an interconnection layer 22 is formed, and an interlayer insulating layer 23 is formed to cover interconnection layer 22.

The structure of the interface between the memory cell array region and the peripheral circuit region will be described in the following.

Figure 6:
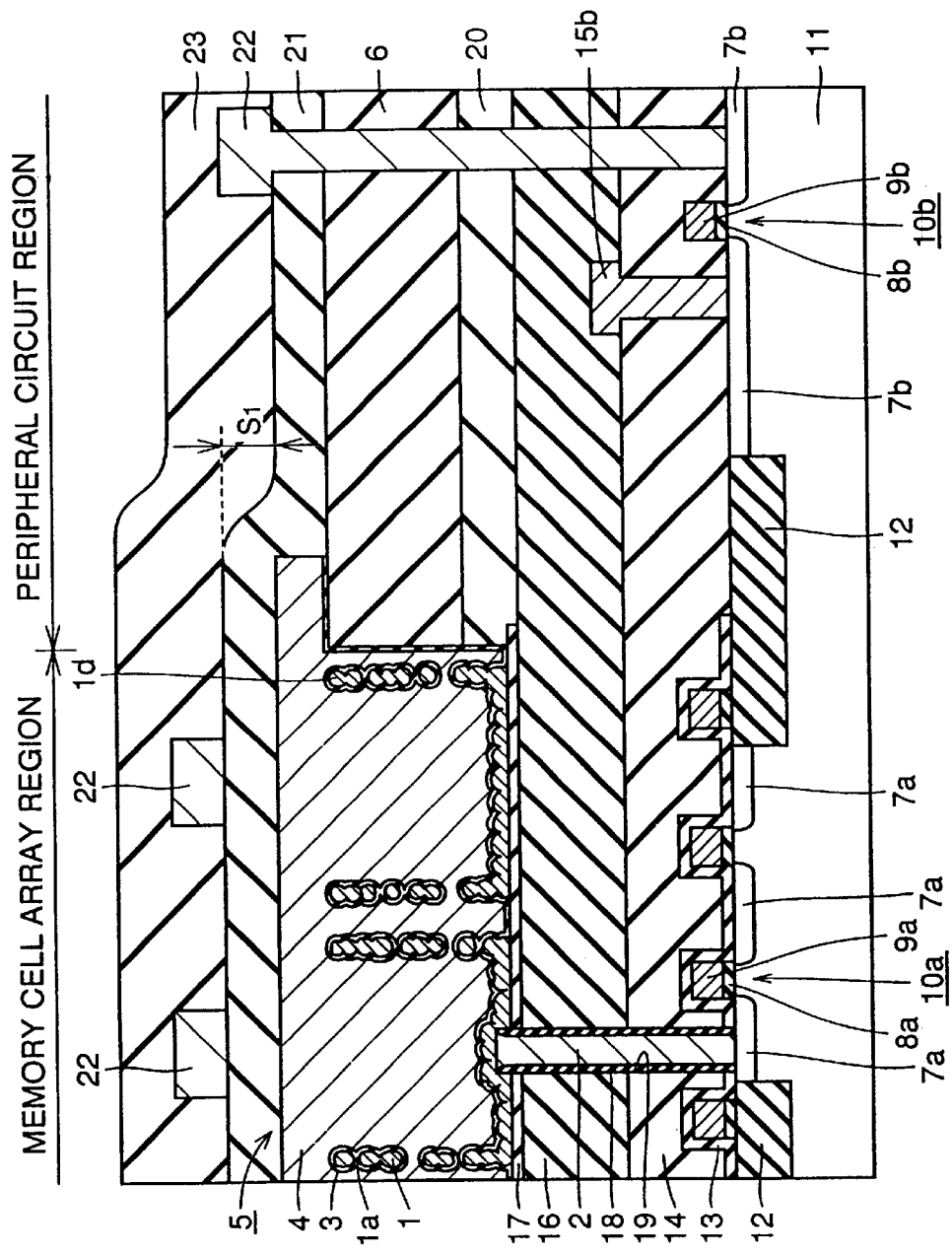
FIG. 6 is a schematic cross section representing an interface between a memory cell array region and a peripheral circuit region of the semiconductor memory device in accordance with an embodiment of the present invention.

Referring to FIG. 6, as described above, MOS transistor 10a and capacitor 5 constituting a memory cell are formed in the memory cell array region, and MOS transistor 10b, for example, for controlling the memory cell is formed in the peripheral circuit region.

Interlayer insulating layers 14 and 16 covering MOS transistors 10a and 10b extend both over the memory cell array region and the peripheral circuit region. The silicon nitride films 13 and 17, however, are substantially formed only in the memory cell array region.

Insulating layers 20 and 6 are formed only in the peripheral circuit region and have end surfaces positioned at the interface between the memory cell array region and the peripheral circuit region, with the end surfaces arranged opposing to the outer peripheral surface of lower electrode 1. End surfaces of insulating layers 20 and 6 extend along the interface portion.

Capacitor dielectric film 3 and upper electrode layer 4 partially rest on the upper surface of insulating layer 6. At a portion in the memory cell array region near the interface between the memory cell array region and the peripheral circuit region, a dummy pattern 1d of the lower electrode is arranged.

Interlayer insulating layers 21 and 23 extend both over the memory cell array region and the peripheral circuit region.

The method of manufacturing a semiconductor memory device in accordance with an embodiment of the present invention will be described in the following.

FIGS. 7 to 16, 17 to 26 and 27 to 36 are cross sectional views corresponding to FIGS. 2, 3 and 5, respectively, showing, in order, the steps of the method of manufacturing the semiconductor memory device in accordance with one embodiment of the present invention.

Figure 7:
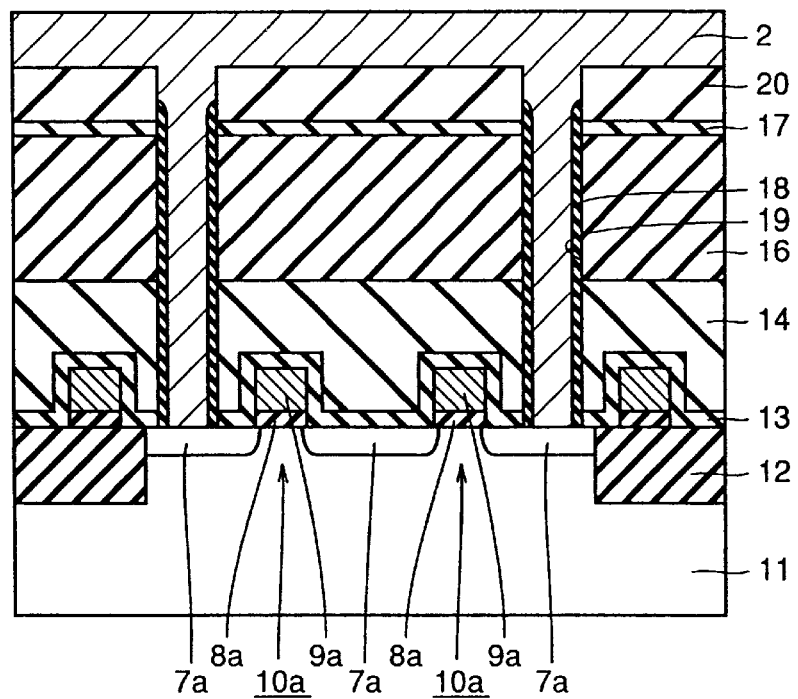
FIGS. 7 to 16 are schematic cross sections taken along the line A—A of FIG. 1, showing, in order, the steps of the method of manufacturing a semiconductor memory device in accordance with an embodiment of the present invention.
Figure 17:
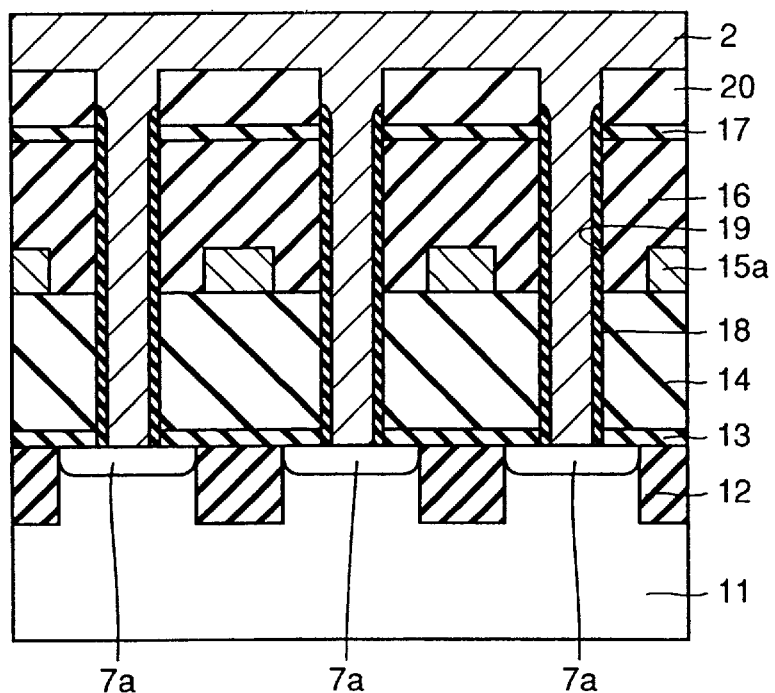
FIGS. 17 to 26 are schematic cross sections taken along the line B—B of FIG. 1, showing, in order, the steps of the method of manufacturing a semiconductor memory device in accordance with an embodiment of the present invention.
Figure 27:
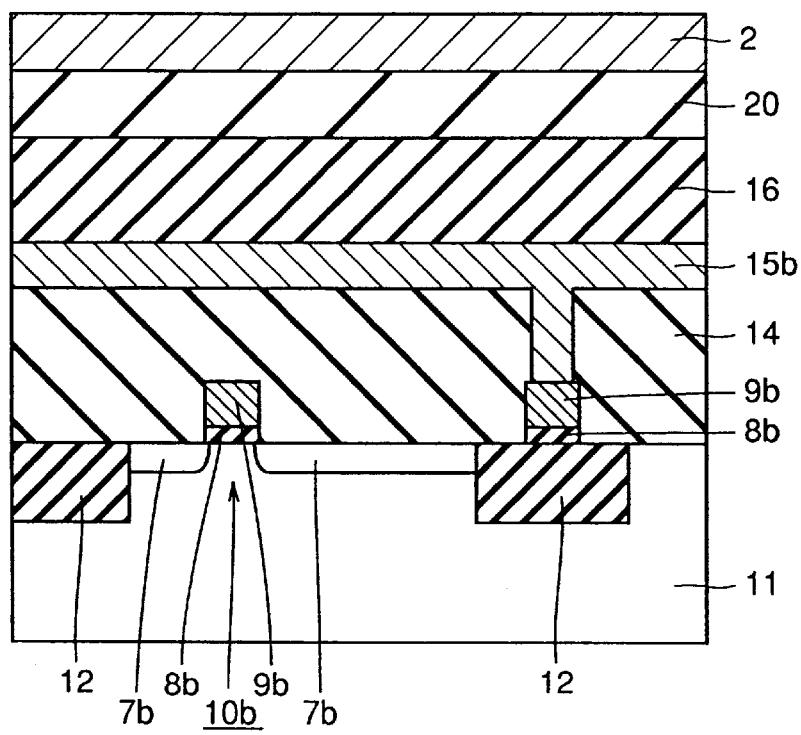
FIGS. 27 to 36 are schematic cross sections of the peripheral circuit region showing, in order, the steps of the method of manufacturing a semiconductor memory device in accordance with an embodiment of the present invention.

First, referring to FIGS. 7, 17 and 27, trench isolation 12 is formed in silicon substrate 11 and thereafter, MOS transistor 10a is formed in the memory cell array region while MOS transistor 10b is formed in the peripheral circuit region. Silicon nitride film 13 is formed to cover MOS transistor 10a, thereafter, interlayer insulating layer 14 is formed both in the memory cell array region and the peripheral circuit region, and bit line 15a and interconnection layer 15b are formed thereon. Further, interlayer insulating layer 16 is formed, silicon nitride film 17 is formed in the memory cell array region, and insulating layer 20 is further formed thereon. Thereafter, contact hole 19 reaching source/drain region 7a from an upper surface of insulating layer 20 is opened, and a sidewall insulating layer 18 of silicon nitride film is formed along an inner wall surface of contact hole 19. To fill contact hole 19, conductive layer 2 formed of amorphous silicon with an impurity introduced (hereinafter referred to as doped amorphous silicon) is formed on insulating layer 20. Conductive layer 2 is etched back by using a gas containing $Cl_2$ and $SF_6$.

Figure 8:
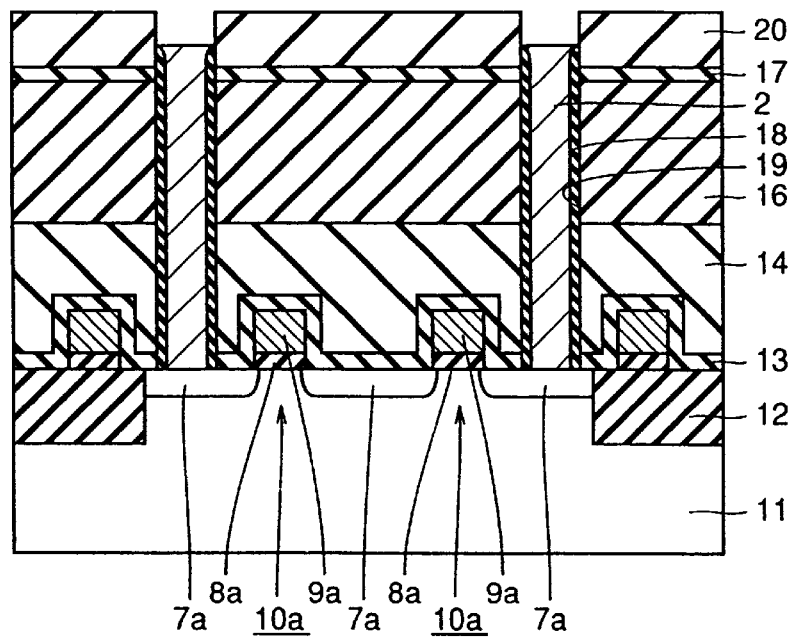
Figure 18:
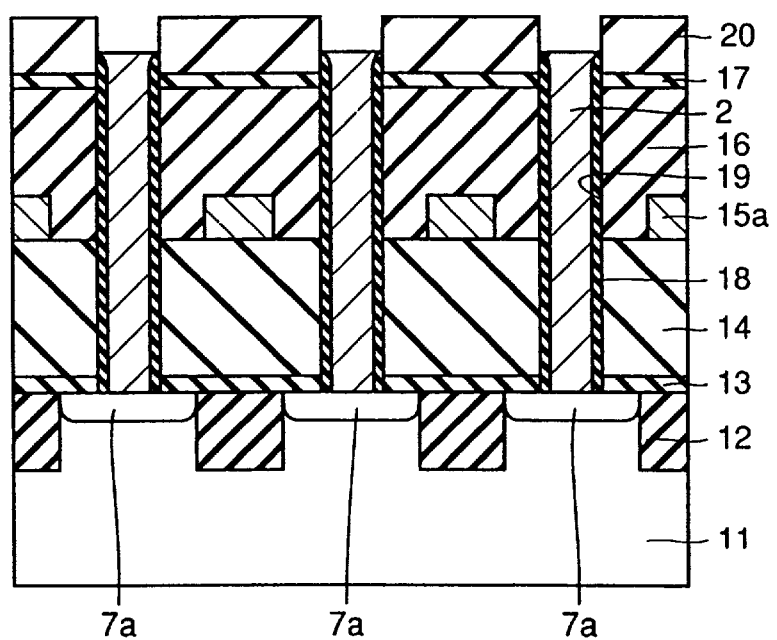
Figure 28:
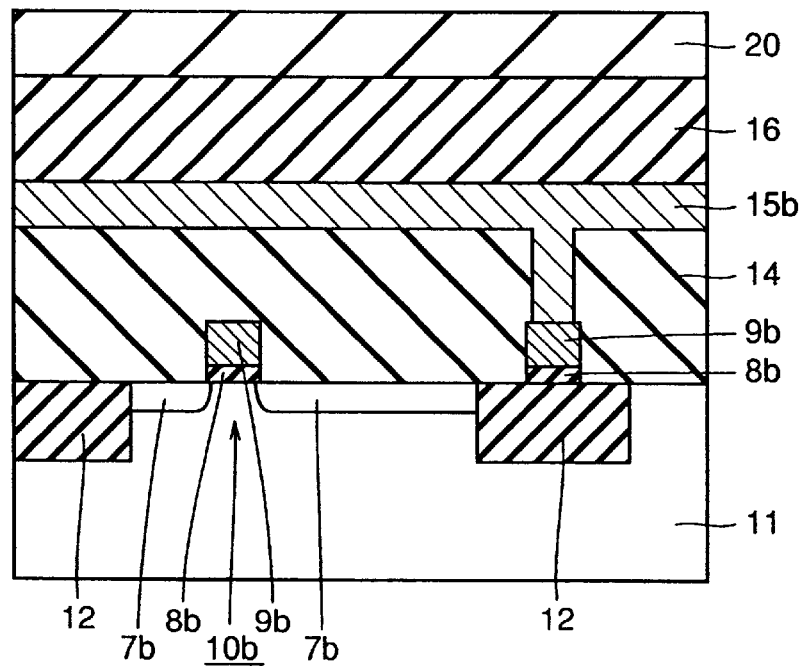

Referring to FIGS. 8, 18 and 28, by the etch back, conductive layer 2 is left to fill contact hole 19, to be a plug layer.

Figure 9:
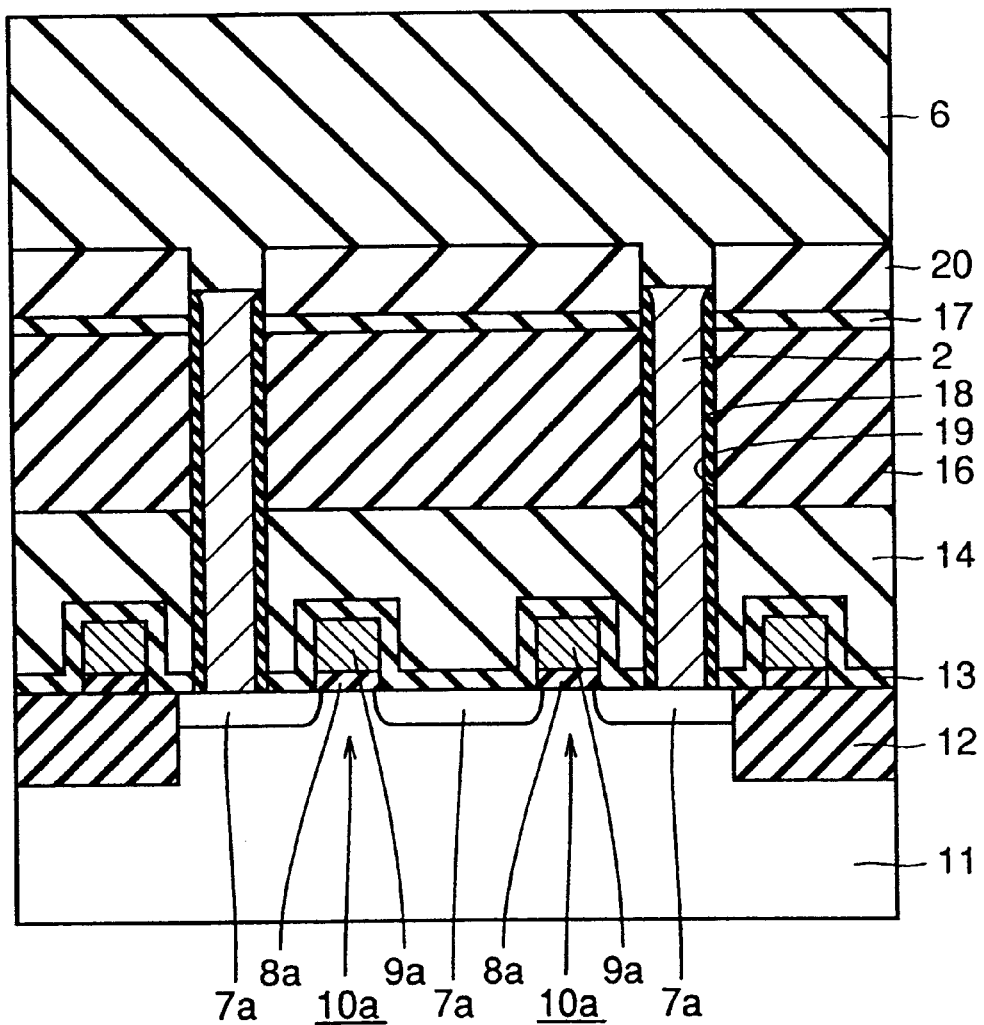
Figure 19:
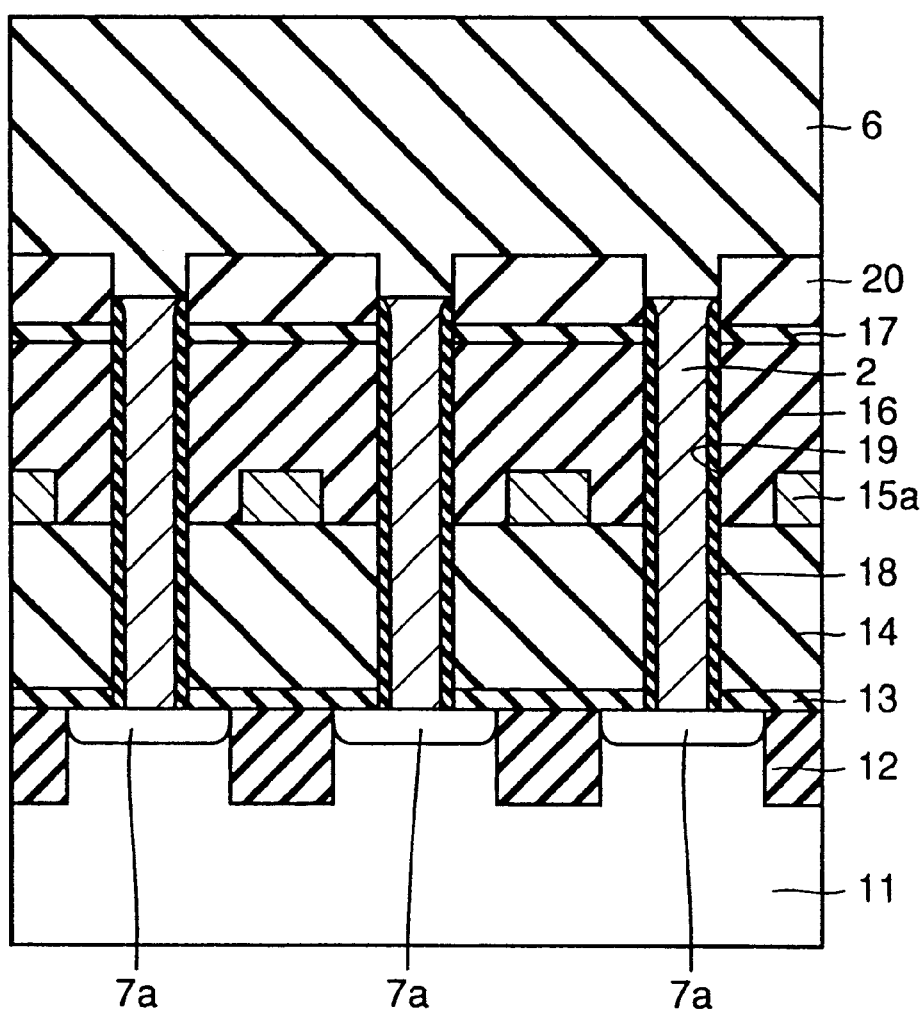
Figure 29:
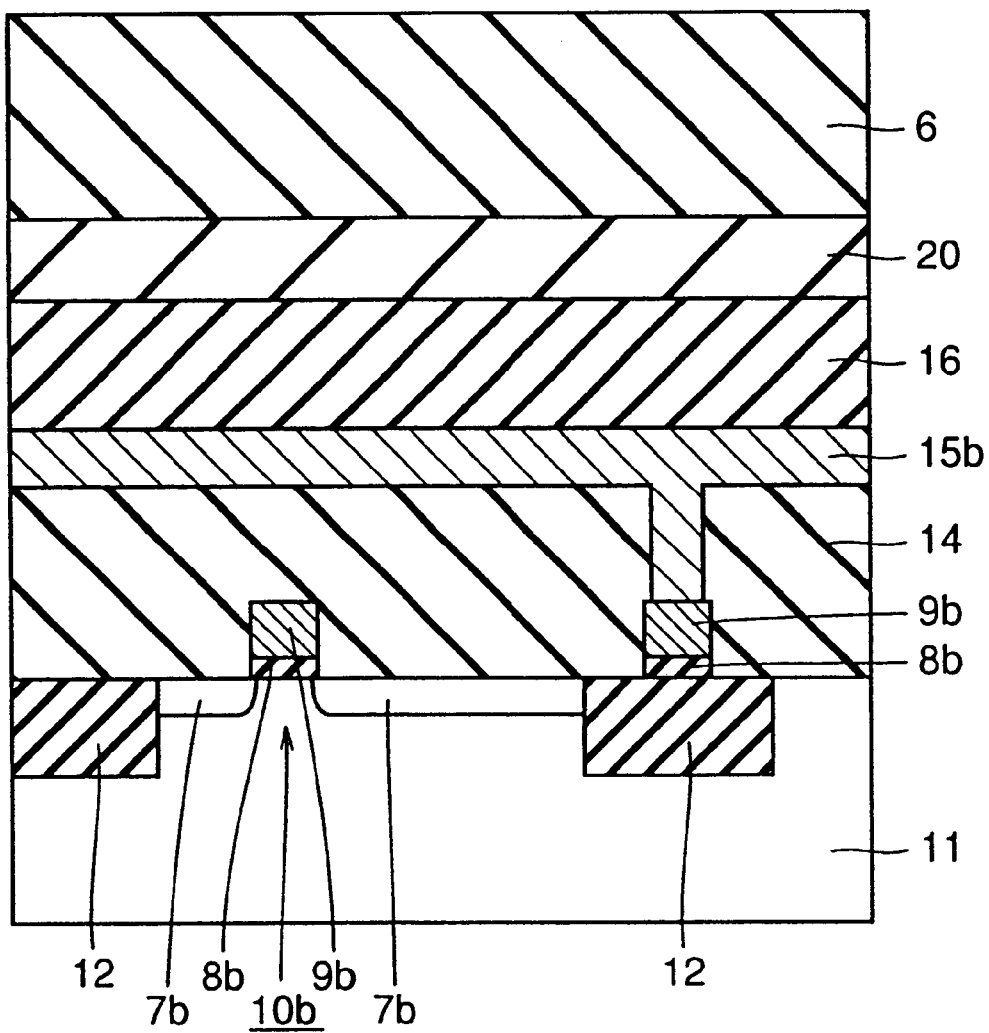

Referring to FIGS. 9, 19 and 29, insulating layer 6 of silicon oxide film, for example, is formed to cover the entire surface. The thickness of insulating layer 6 is determined by capacitor capacitance.

Figure 10:
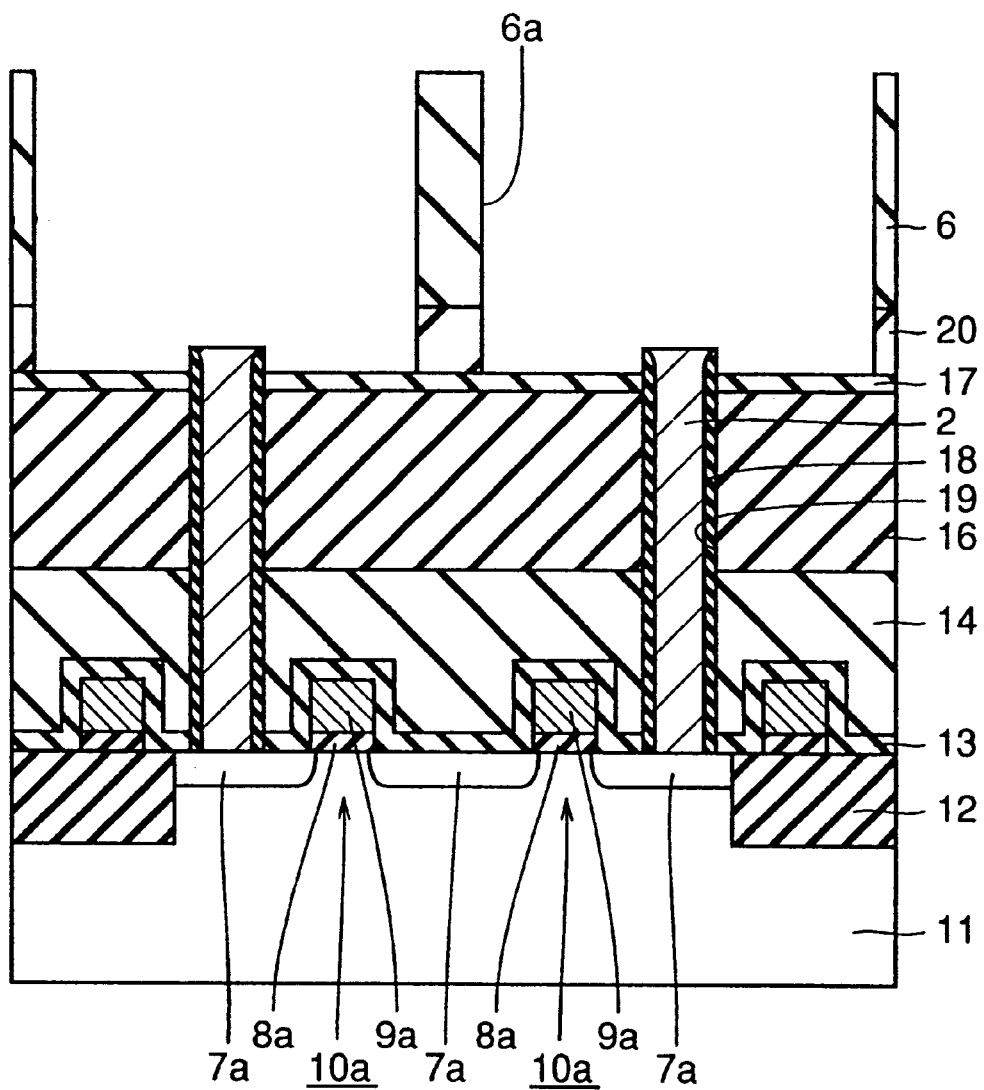
Figure 20:
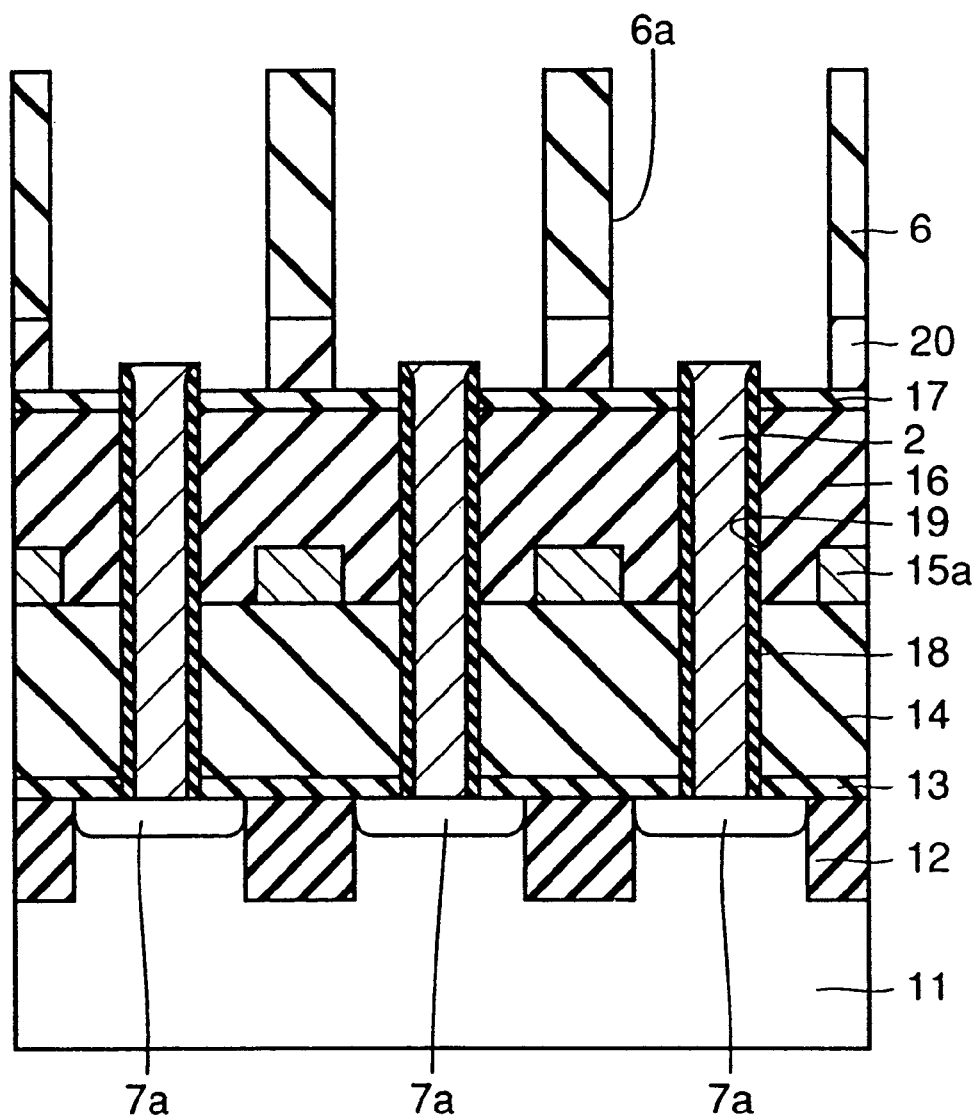
Figure 30:
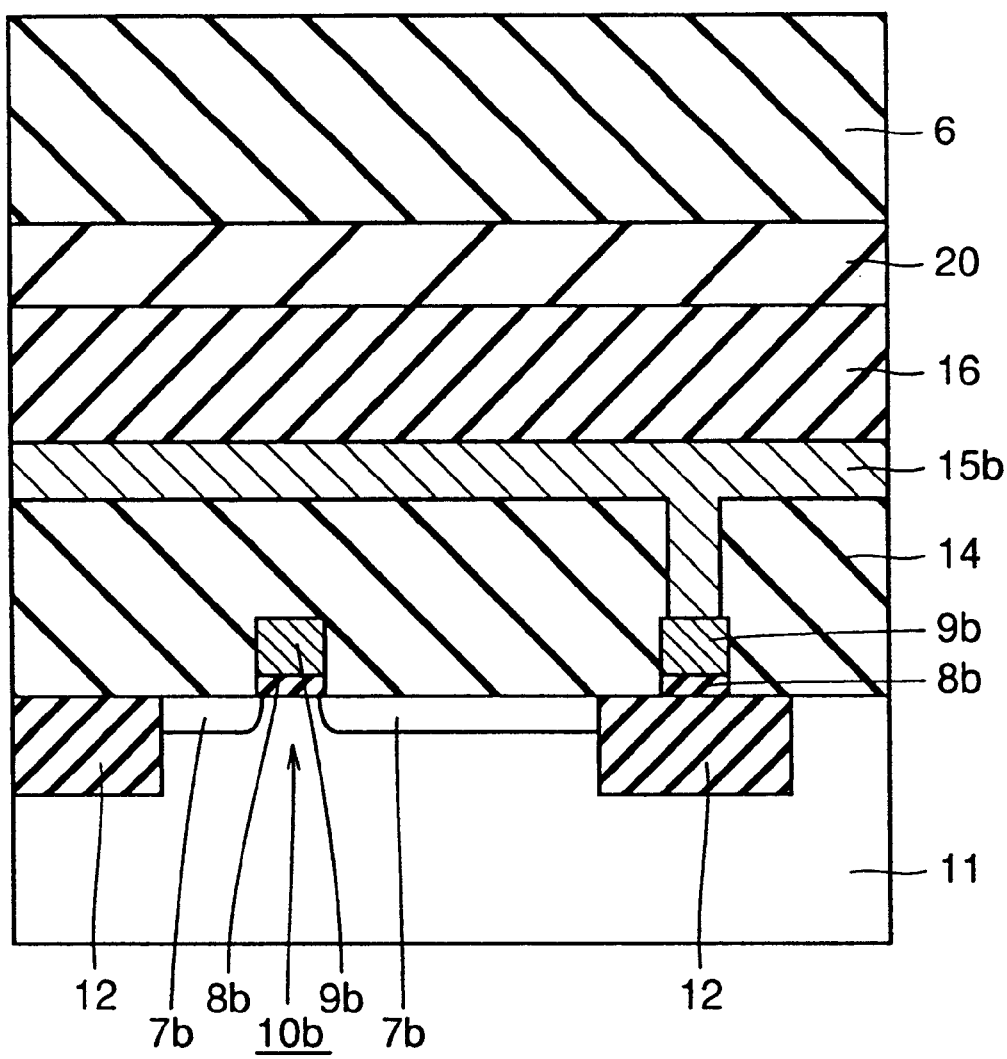

Referring to FIGS. 10, 20 and 30, insulating layers 6 and 20 are patterned by the common photolithography and etching techniques. The etching is performed by using a gas containing $C_4 F_8$ or $CH_2 F_2$, for example, in such a manner in that silicon nitride films 17 and 18 function as an etching stopper. Thus, an opening 6a for the lower electrode is formed in insulating layers 6 and 20 and a portion of the surface of lower silicon nitride film 17 and an upper surface of plug layer 2 are exposed. As silicon nitride films 17 and 18 function as an etching stopper in the etching process, opening 6a for the lower electrode does not reach the bit line 15a.

Figure 11:
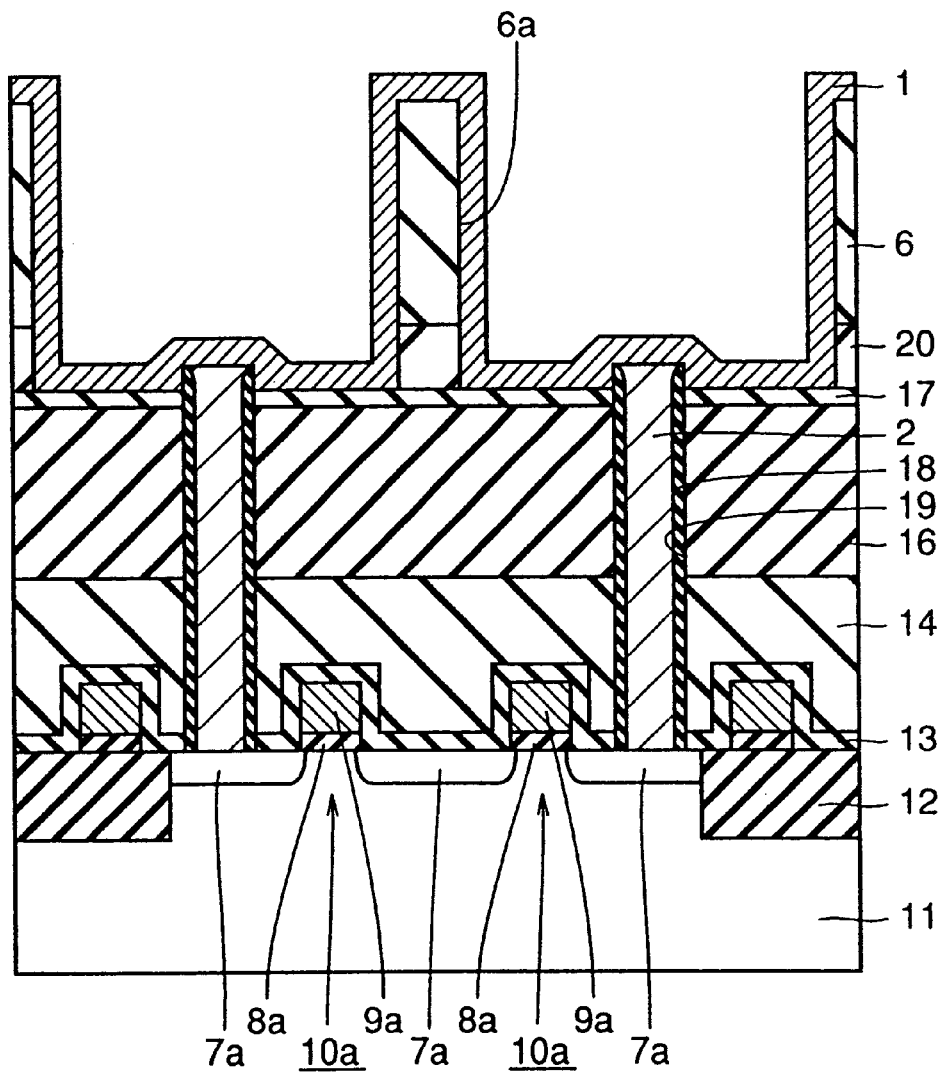
Figure 21:
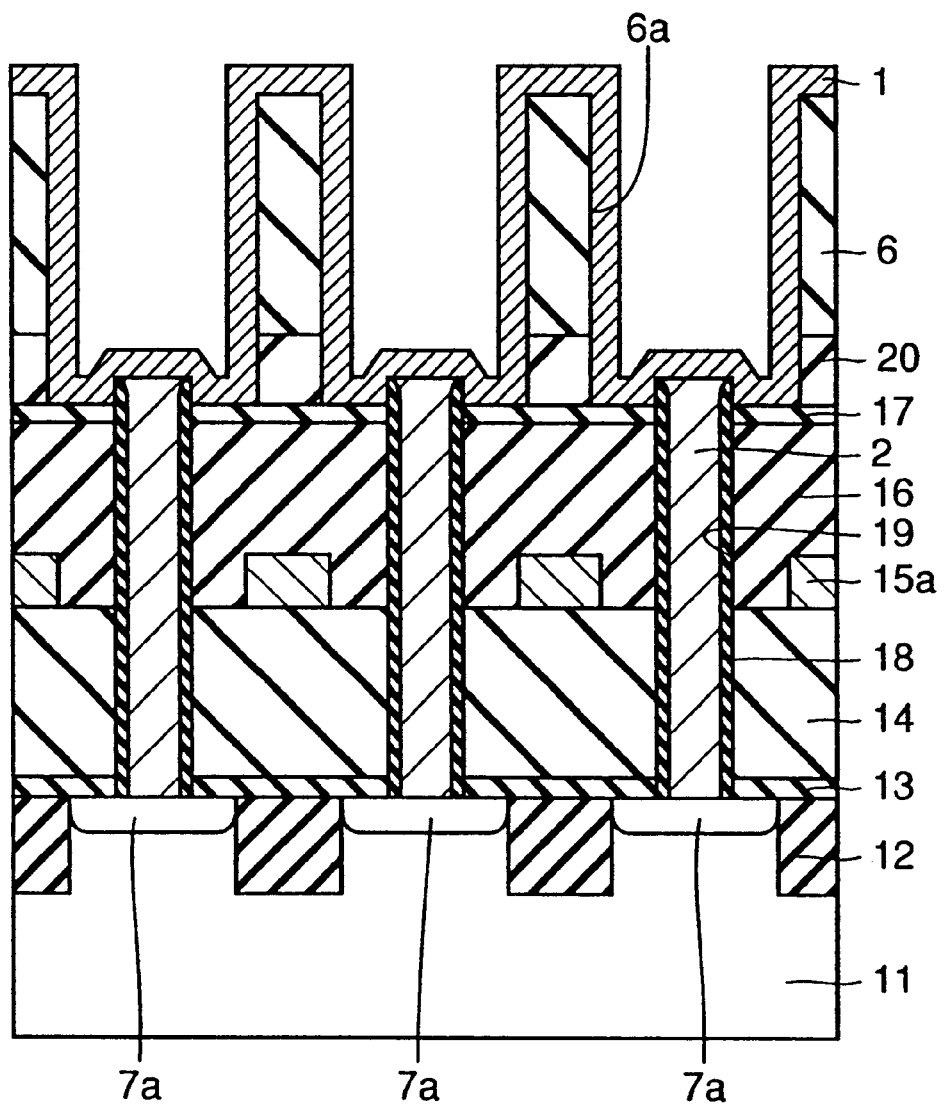
Figure 31:
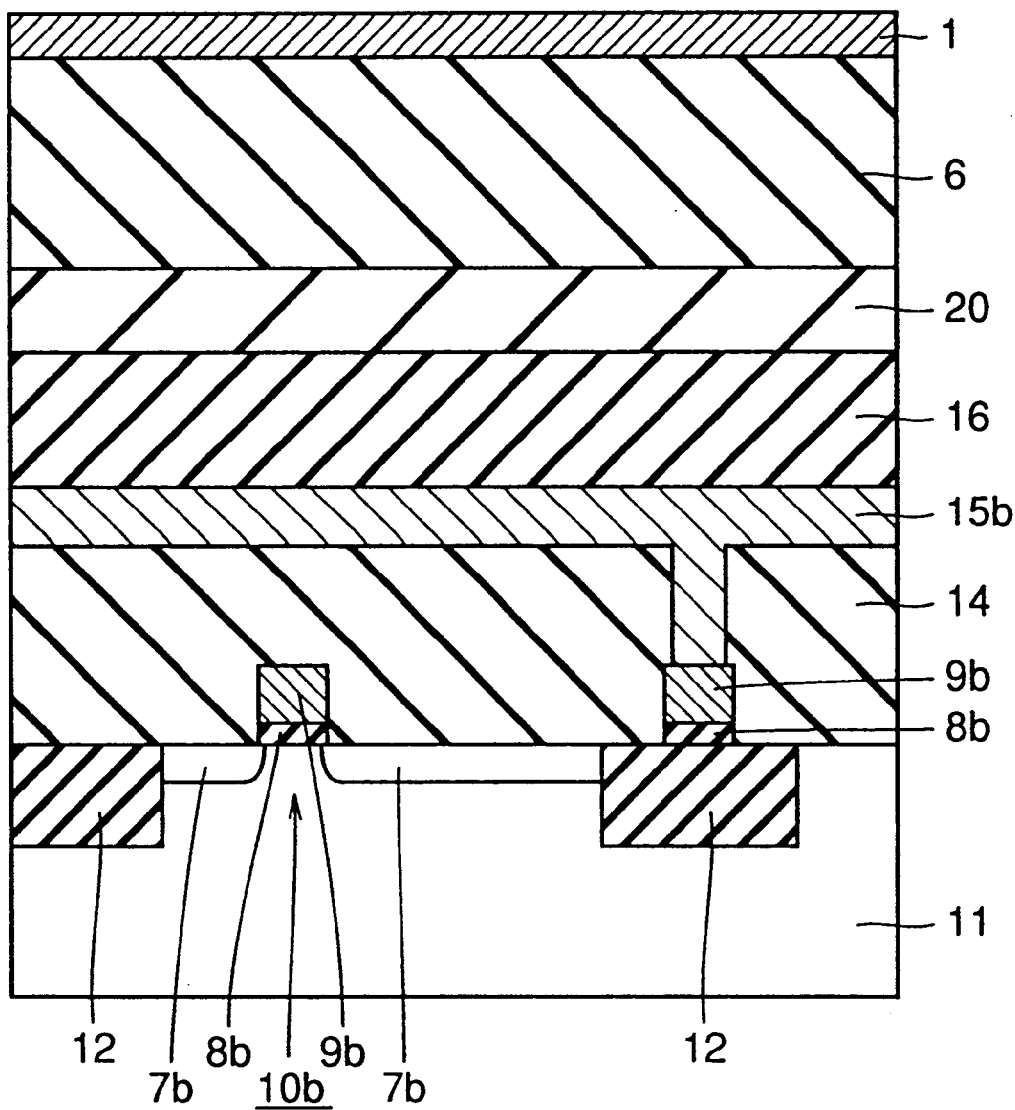

Referring to FIGS. 11, 21 and 31, conductive layer 1 of doped amorphous silicon, for example, is formed to the thickness of 100 to 1000 Å to be in contact with an upper surface of insulating layer 6 and with an inner wall surface of opening 6a for the lower electrode. Conductive layer 1 may be formed by direct growth of doped amorphous silicon, or may be formed first by forming an amorphous silicon without any impurity contained (non-doped amorphous silicon) and thereafter introducing an impurity to provide the doped amorphous silicon.

Figure 12:
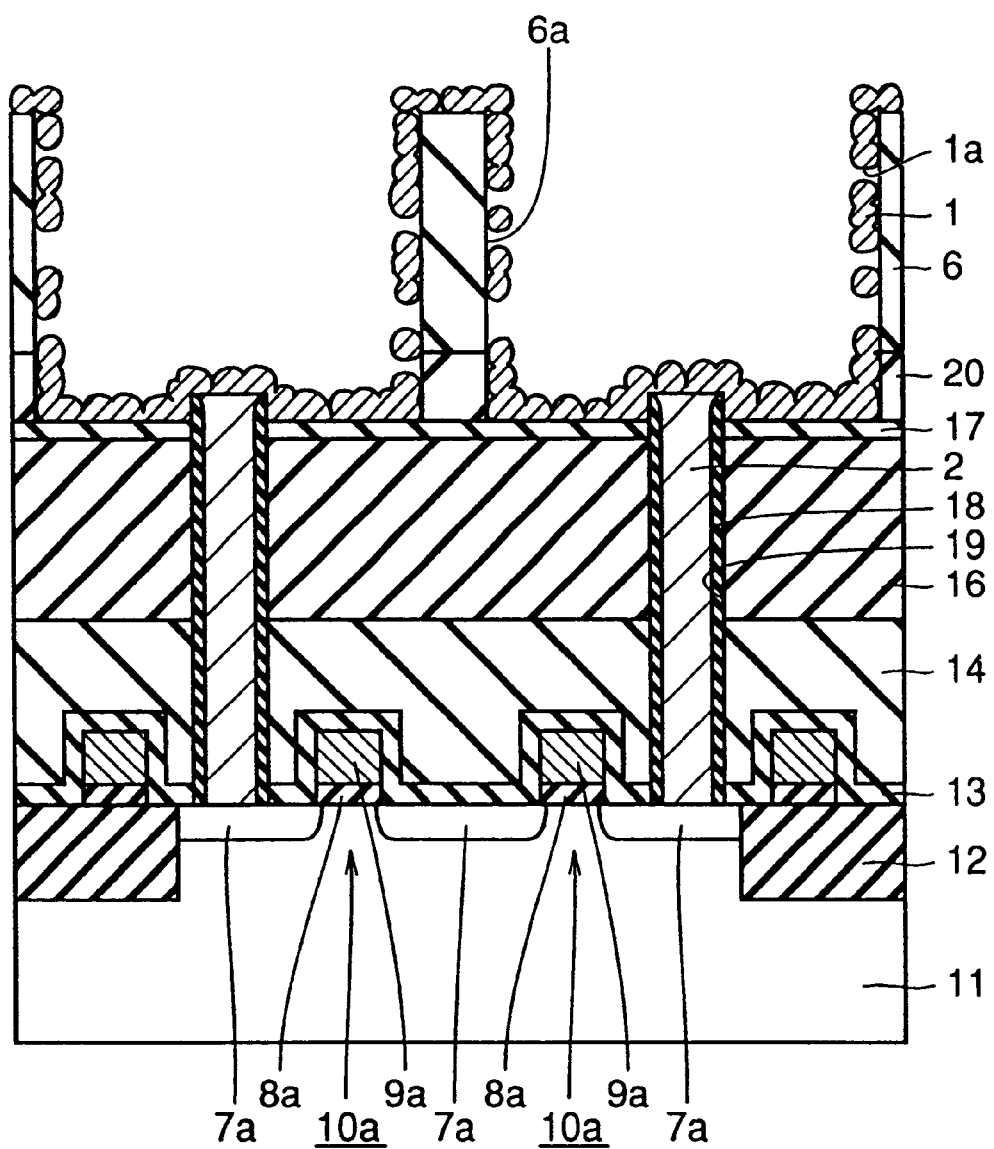
Figure 22:
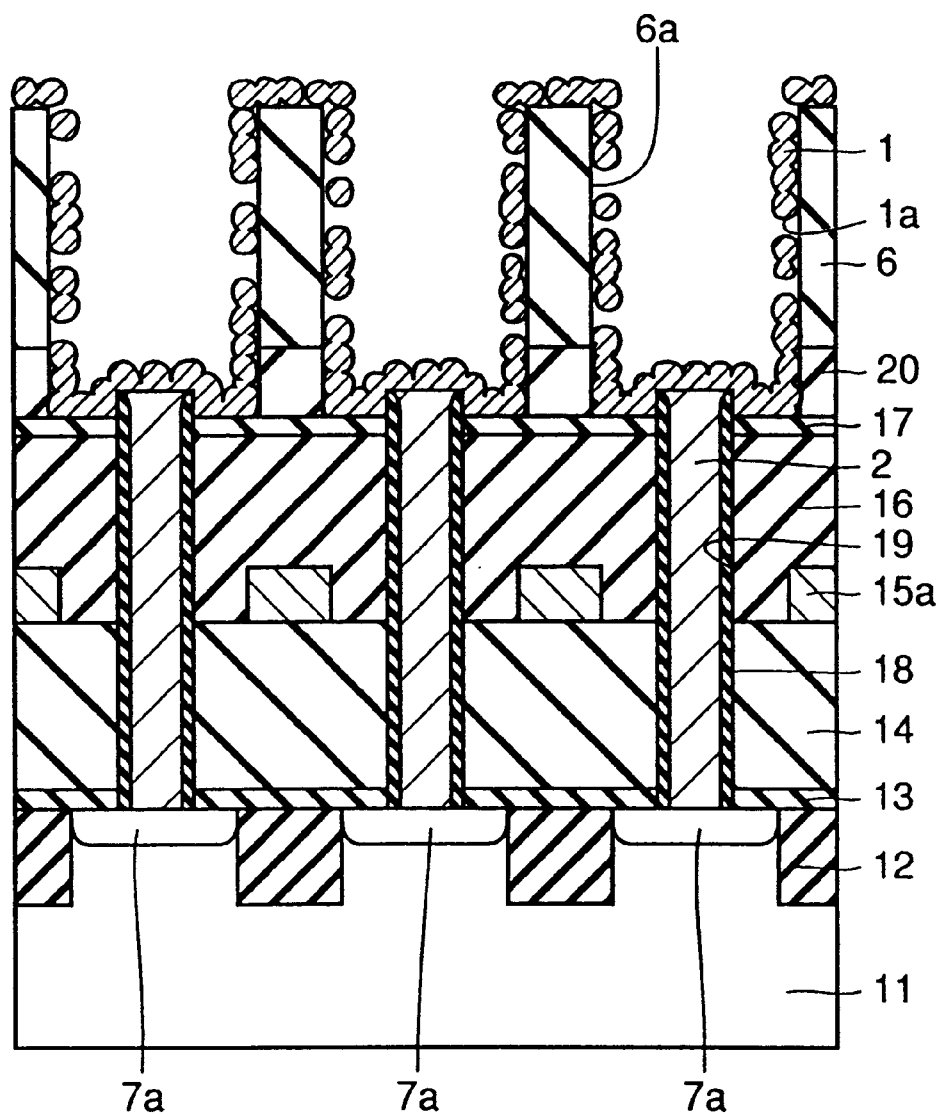
Figure 32:
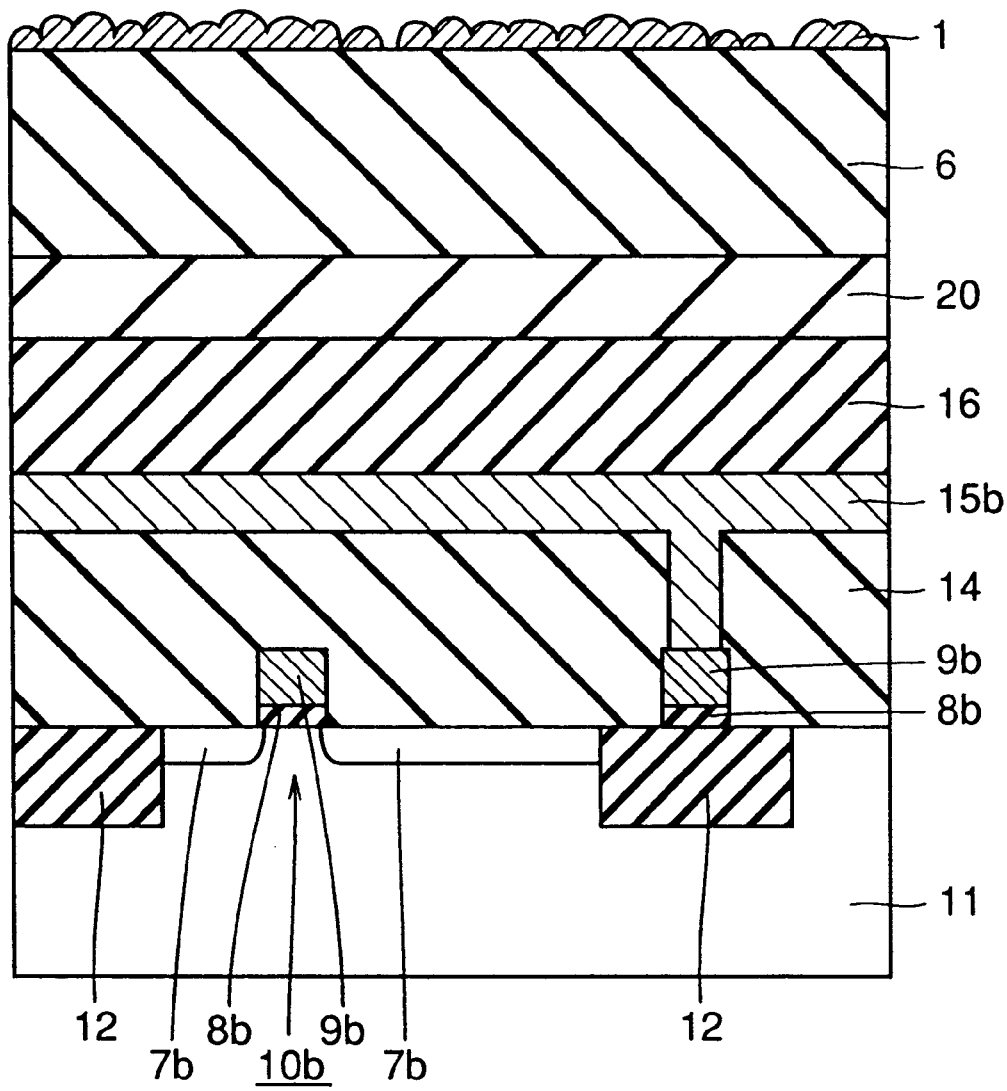

Referring to FIGS. 12, 22 and 32, heat treatment for making the conductive layer porous and rough is performed with the pressure of $1 \times 10^{-4}$ Torr, at a process temperature of 600° C. to 620° C. for the time period of 1 minute to 5 minutes. Thus, conductive layer 1 is made porous and rough, a number of pores 1a are formed therein and protrusions and recesses are formed on the surface.

Figure 13:
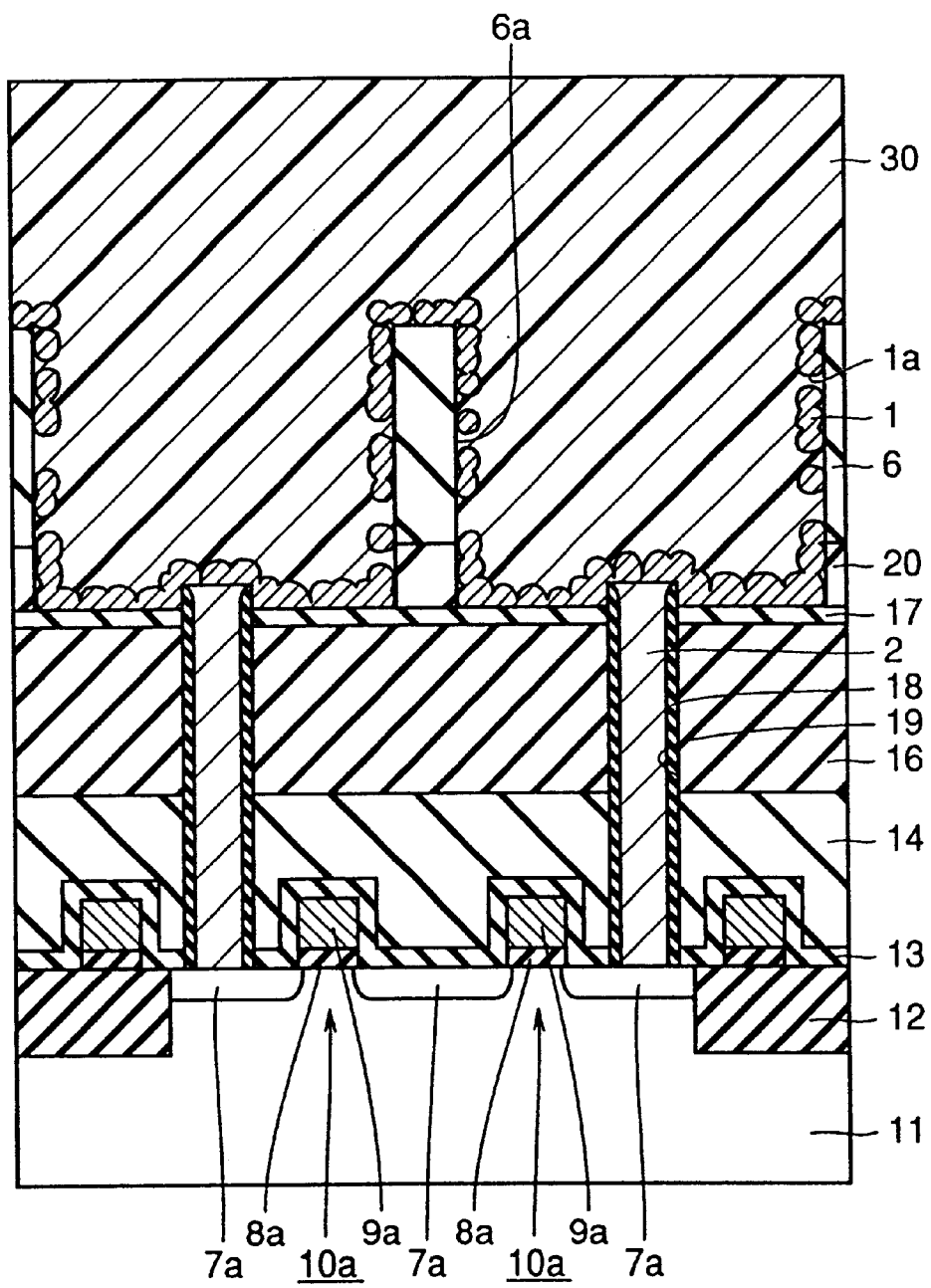
Figure 23:
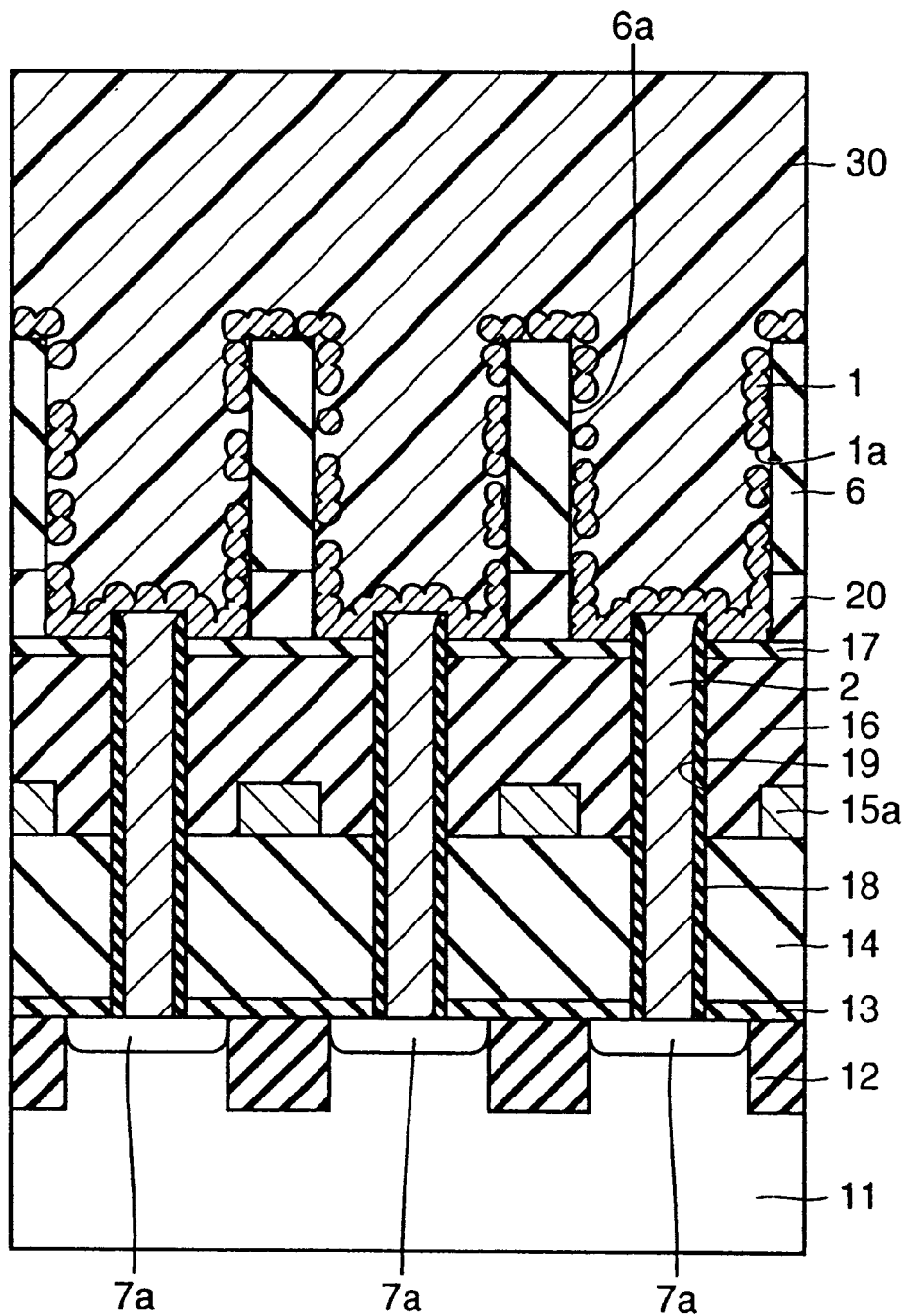
Figure 33:
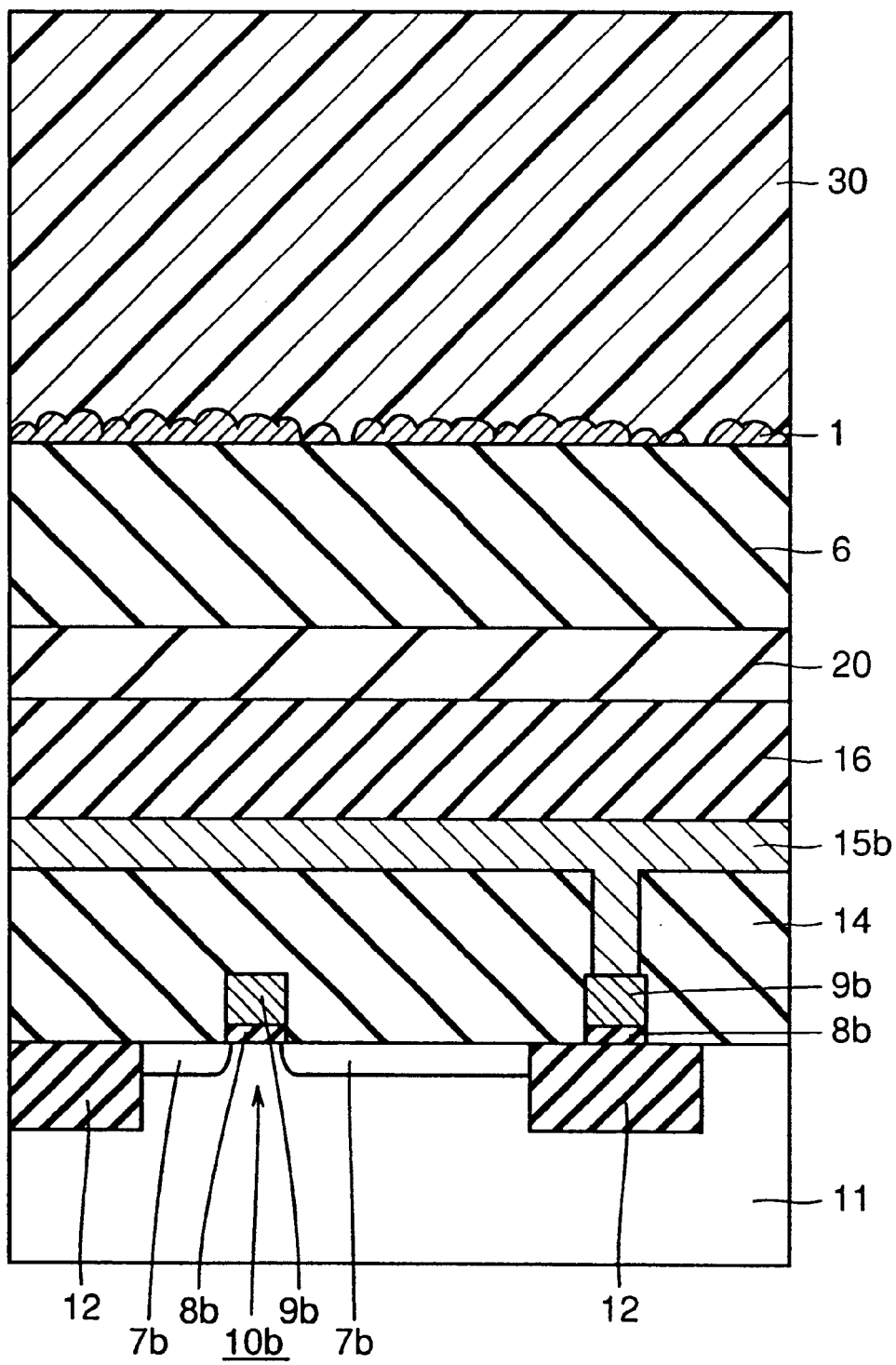

Referring to FIGS. 13, 23 and 33, a photo resist 30 is applied to the entire surface. Thereafter, if the photo resist 30 is of positive type, exposure is performed, followed by development, and if the photo resist is of negative type, development is performed without exposure.

Figure 14:
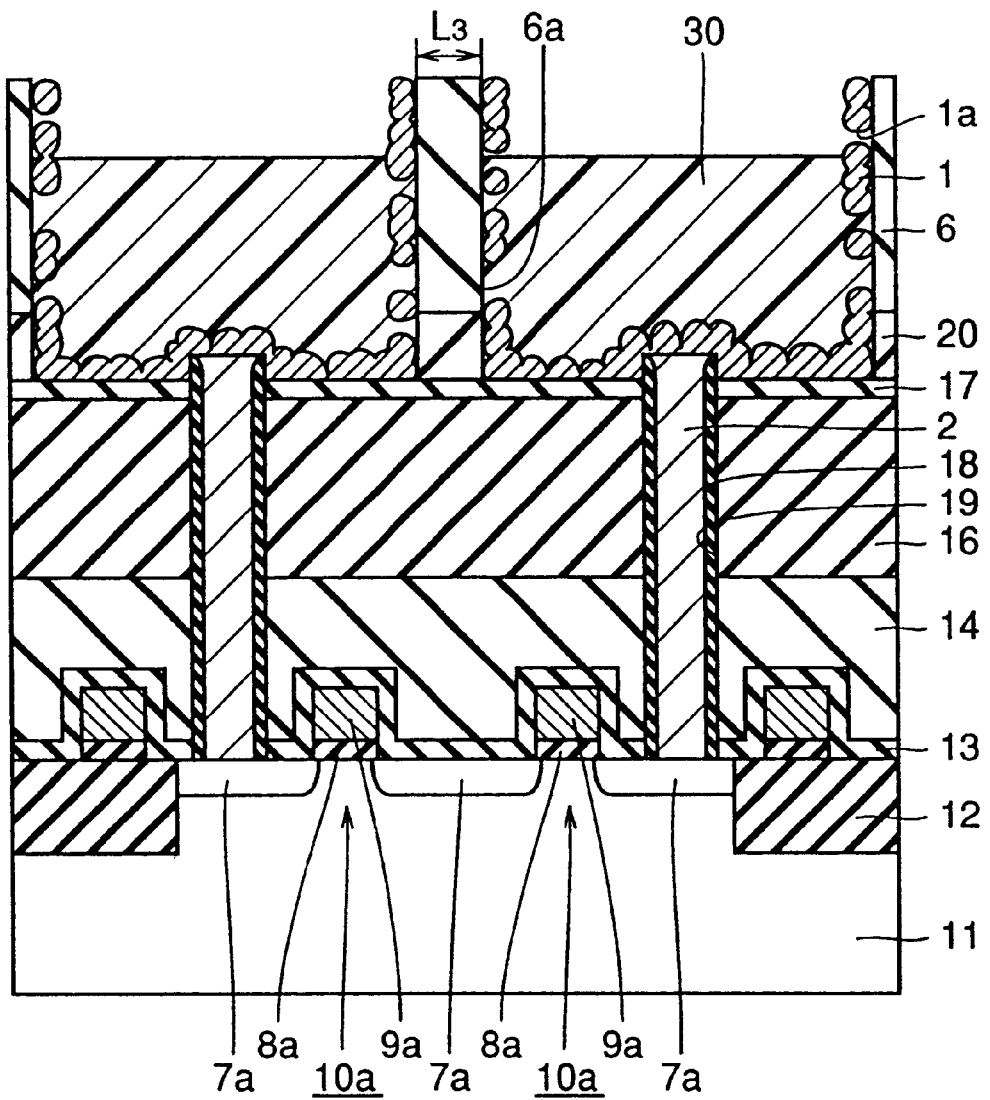
Figure 24:
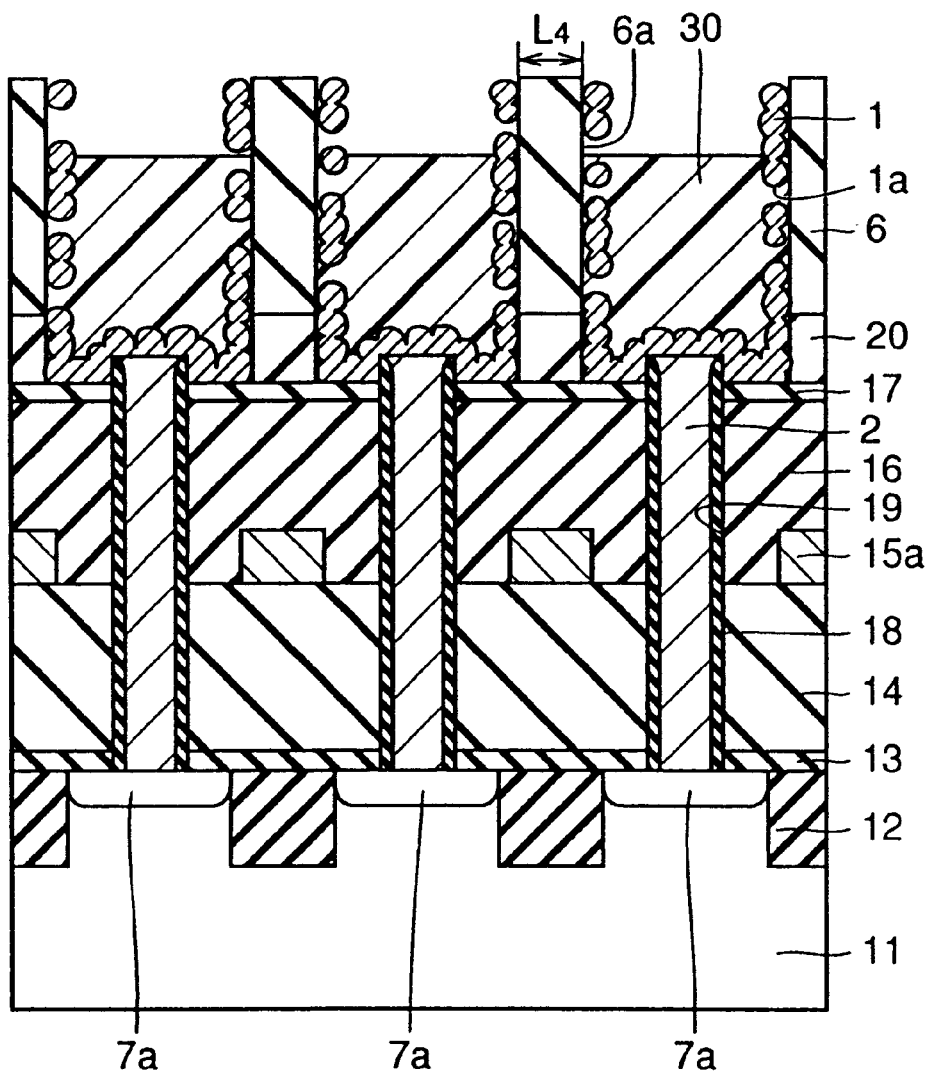
Figure 34:
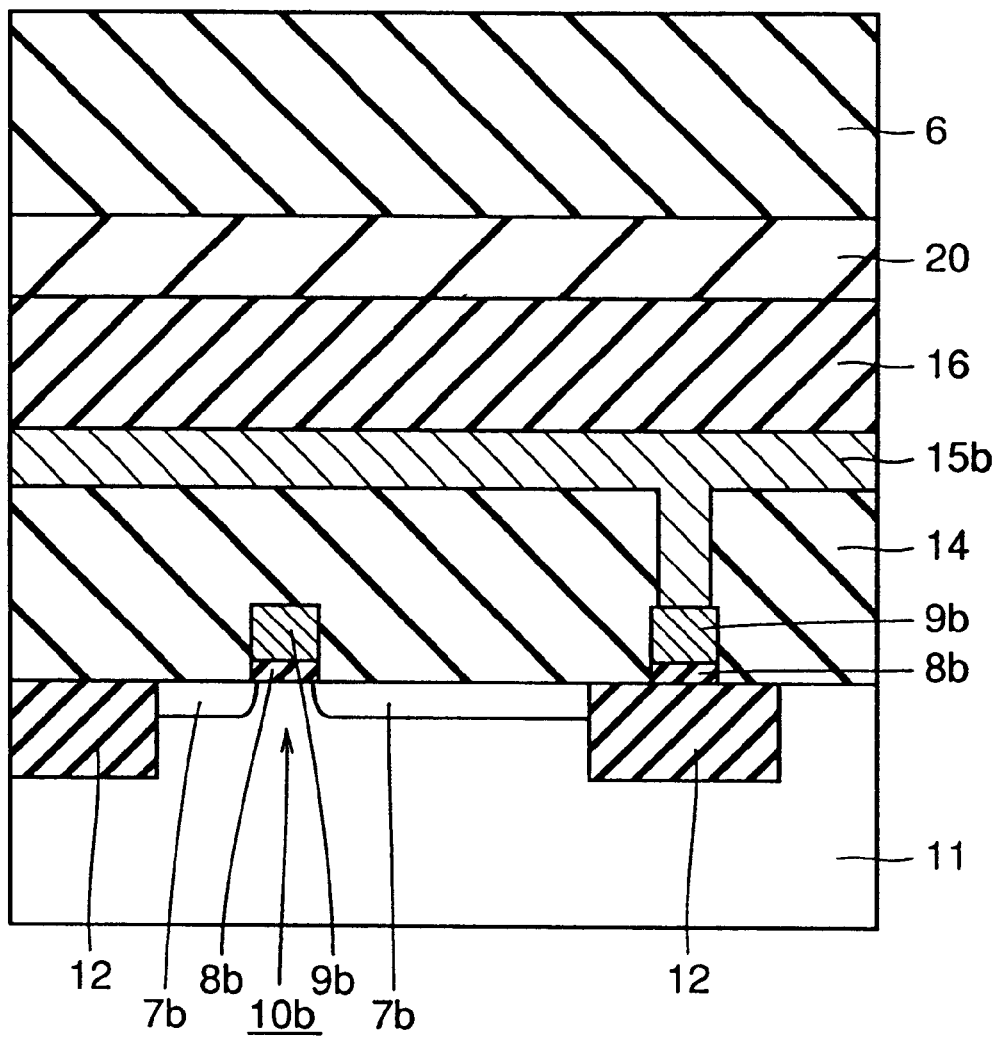

Referring to FIGS. 14, 24 and 34, by the development, photo resist 30 is left only at the bottom portion of opening 6a for the lower electrode, and the upper surface of conductive layer 1 is exposed. More specifically, photo resist 30 is left in the following manner.

Figure 37:
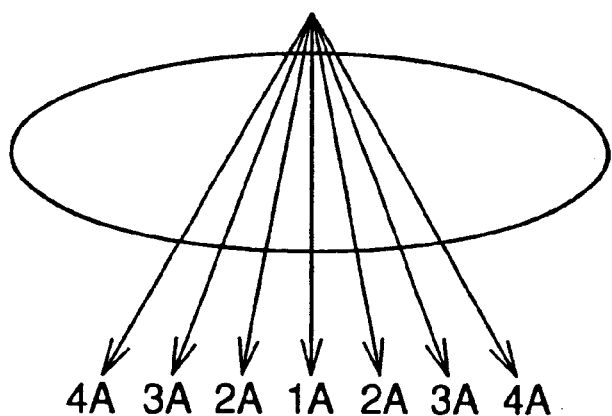
FIG. 37 is an illustration of a light beam when an iris of the optical system is made large.

When photo resist 30 is a positive photo resist, only that portion which has been exposed to a certain extent is melt and removed by development. At the time of exposure, when the iris of the optical system is large, photo resist 30 will be exposed by a light beam 1a vertically incident on the surface of the photo resist as well as by light beams 2A, 3A and 4A obliquely incident on the surface of the photo resist, as shown in FIG. 37. If the obliquely incident light beams 2A, 3A and 4A occupy a large proportion, a region relatively shallow from the surface of photo resist 30 can be exposed to such an extent that enables melting and removal by development. However, a relatively deep region cannot be exposed to such an extent. When photo resist 30 is developed in such a state, photo resist 30 is left only at the bottom portion of opening 6a for the lower electrode.

Figure 38:
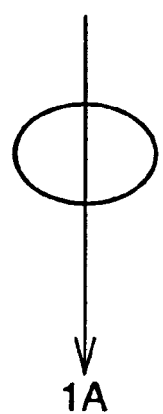
FIG. 38 is an illustration of a light beam when an iris of the optical system is made small.

When the iris of the optical system is made small, the ratio of light beam 1A vertically incident on the surface of photo resist 30 increases, as shown in FIG. 38. Therefore, not only portions near the surface of photo resist 30 but also deep portions can be exposed to such an extent that enables melting and removal by development. In this case, therefore, all the photo resist 30 can be melt and removed by development.

Further, photo resist 30 can be melt and removed by development without exposure. Therefore, by controlling the amount of melting at the time of development, it is possible to leave photo resist 30 only at the bottom portion of opening 6a for the lower electrode. In this case, photo resist 30 may be positive or negative.

By such a method, it becomes possible to leave photo resist 30 only at the bottom portion of opening 6a for the lower electrode without using any mask.

With photo resist 30 left in the above described manner, conductive layer 1 is subjected to anisotropic etching, using a gas containing $Cl_2$ and $SF_6$. Thus, only the conductive layer 1 positioned at the upper surface of insulating layer 6 is removed while conductive layer 1 in opening 6a for the lower electrode is left, so that lower electrode 1 having a cylindrical portion is formed. Further, upper surface of insulating layer 6 is exposed both in the memory cell array region and the peripheral circuit region. Thereafter, photo resist 30 left at the bottom portion of opening 6a for the lower electrode is removed by ashing.

Thereafter, to remove insulating layers 20 and 6, isotropic etching (for example, wet etching) is performed on the entire surface. At the time of this etching, etchant entering the opening 6a for the lower electrode reaches through pores 1a of lower electrode 1 to the outer peripheral side of lower electrode 1, so that insulating layers 20 and 6 are removed by etching in the lateral direction in the figure. Therefore, by the amount of etching of 0.5 times to two times of the width (dimensions $L_3$, $L_4$ between adjacent to lower electrodes 1) of insulating layers 20 and 6, it is possible to completely remove insulating layers 20 and 6 between the lower electrodes 1. In other words, the amount of etching can significantly be reduced than when the insulating layers 20 and 6 are removed in the vertical direction in the figure.

In this etching, silicon nitride films 17 and 18 serve as barriers for etching, and therefore removal of interlayer insulating layer 16 by the etching can be prevented.

Figure 15:
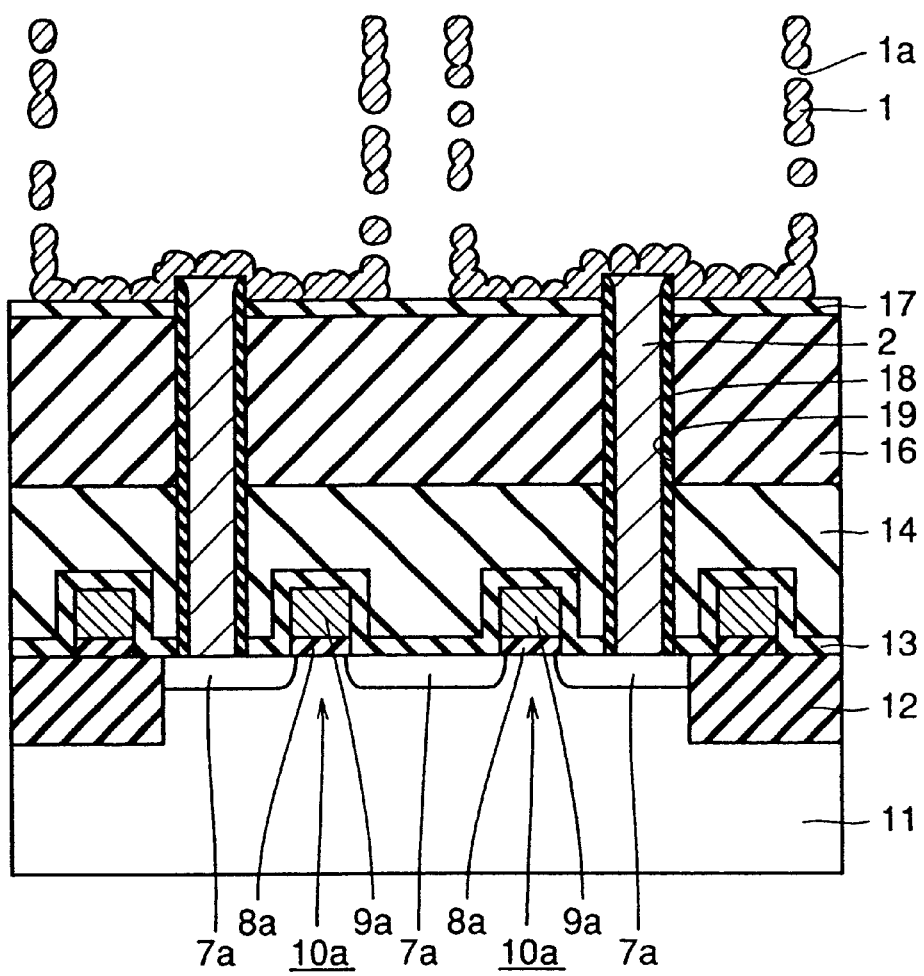
Figure 25:
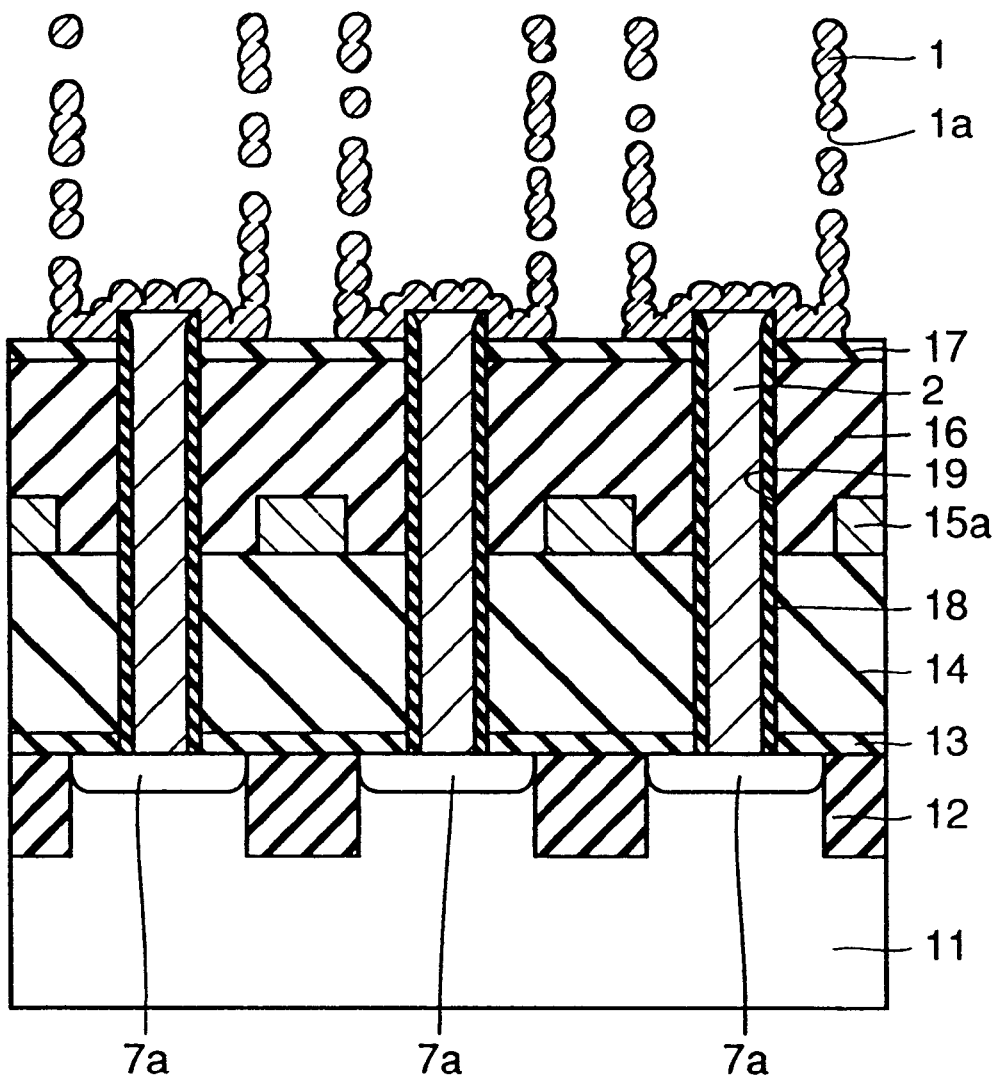
Figure 35:
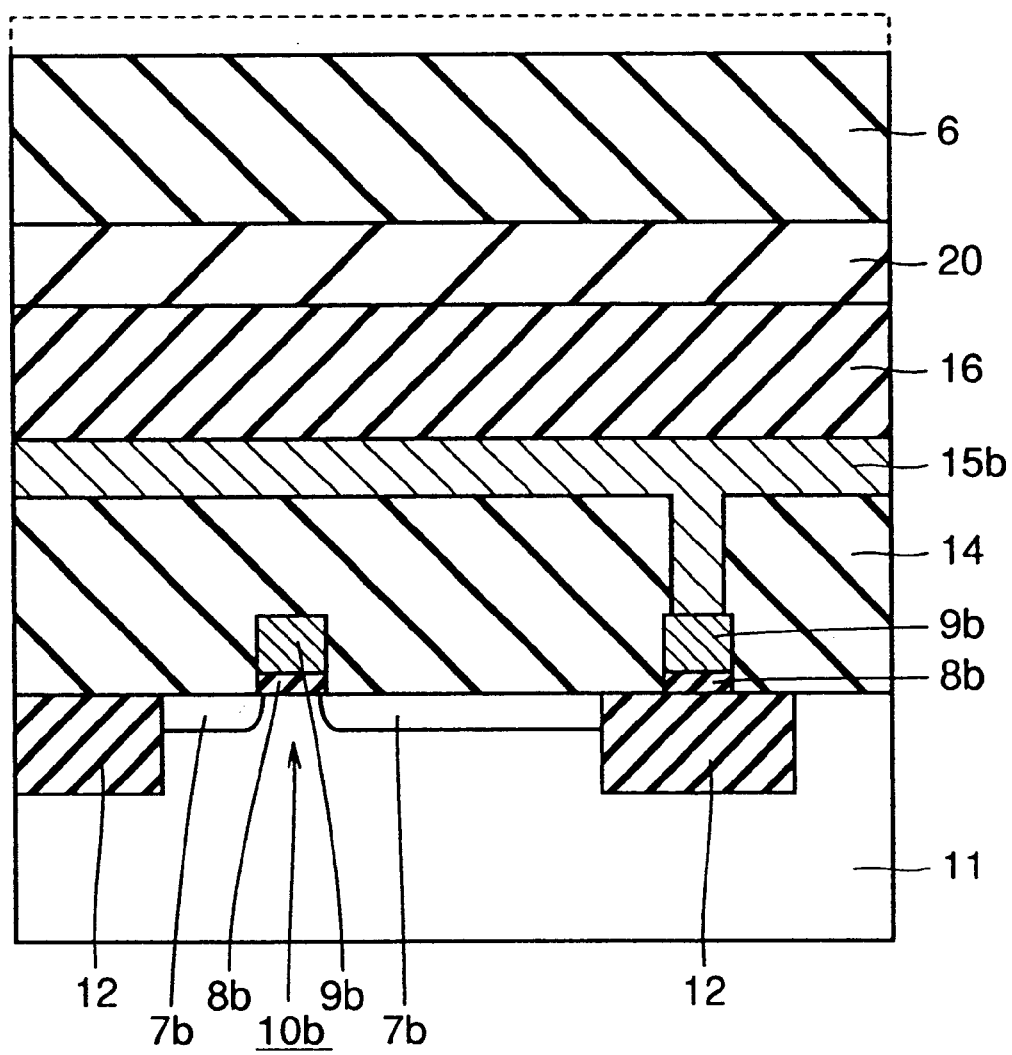

Referring to FIGS. 15, 25 and 35, by this etching, insulating layers 20 and 6 between adjacent lower electrodes 1 are completely removed in the memory cell array region, while an upper surface of insulating layer 6 is removed to some extent in the peripheral circuit region. More specifically, by this etching, it is possible to suppress reduction in thickness in the vertical direction, and therefore a mask for protecting insulating layer 6 in the peripheral circuit region is unnecessary.

Figure 16:
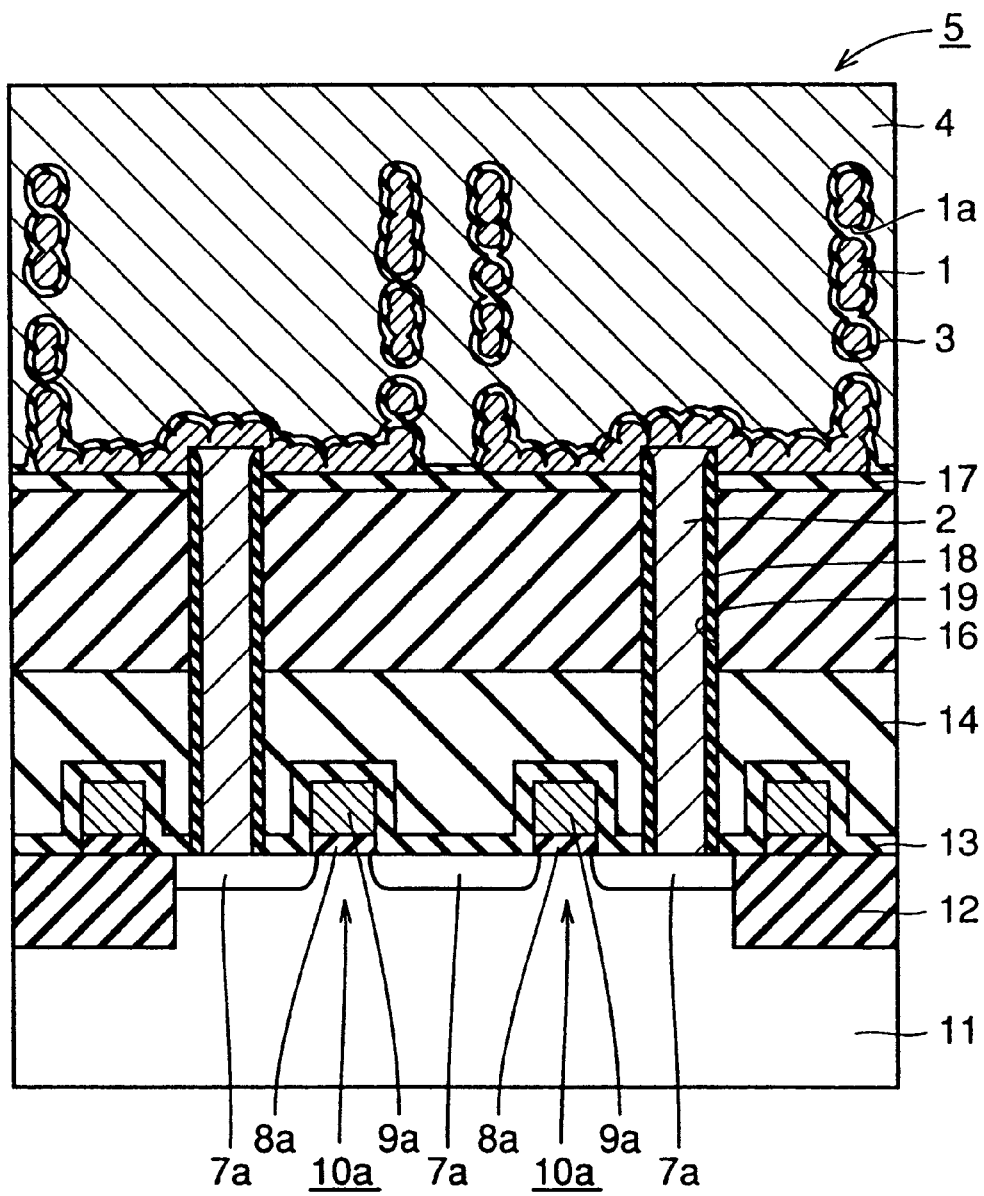
Figure 26:
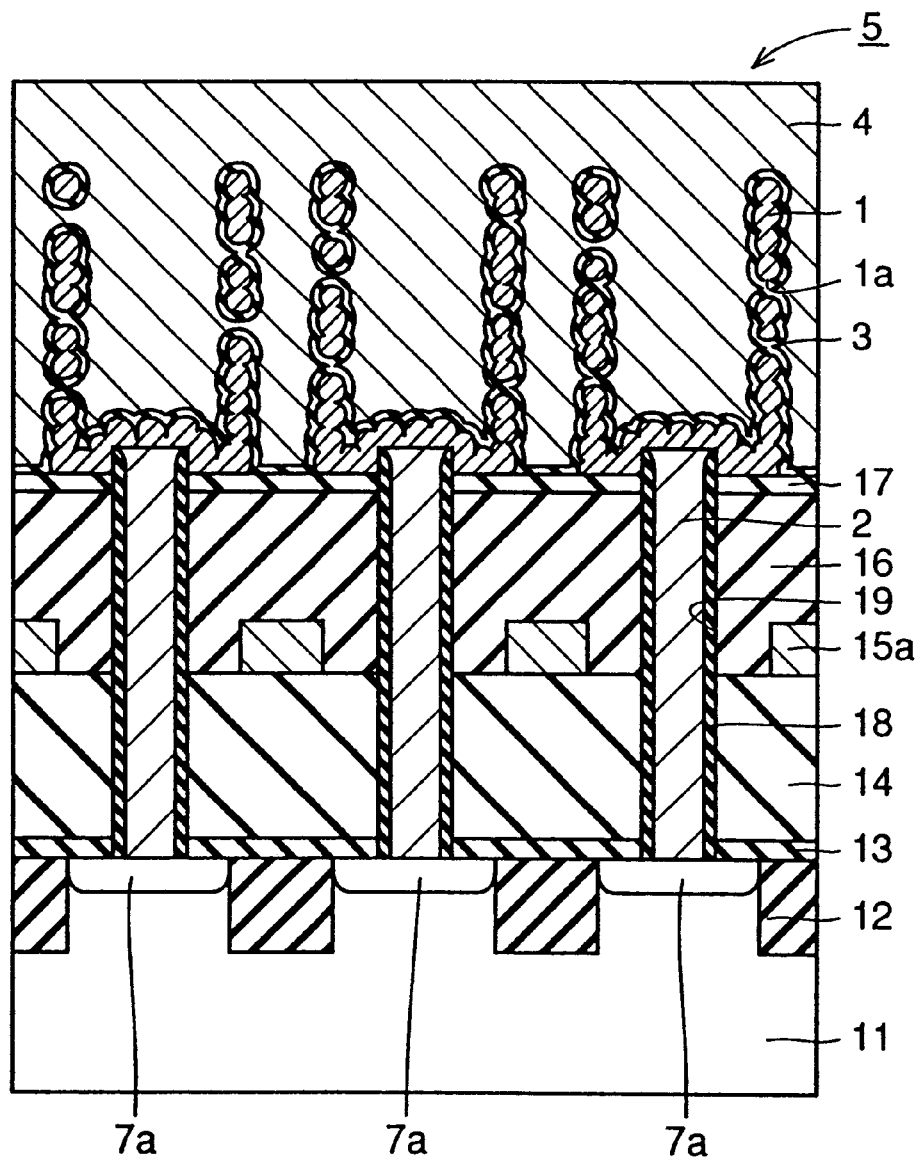
Figure 36:
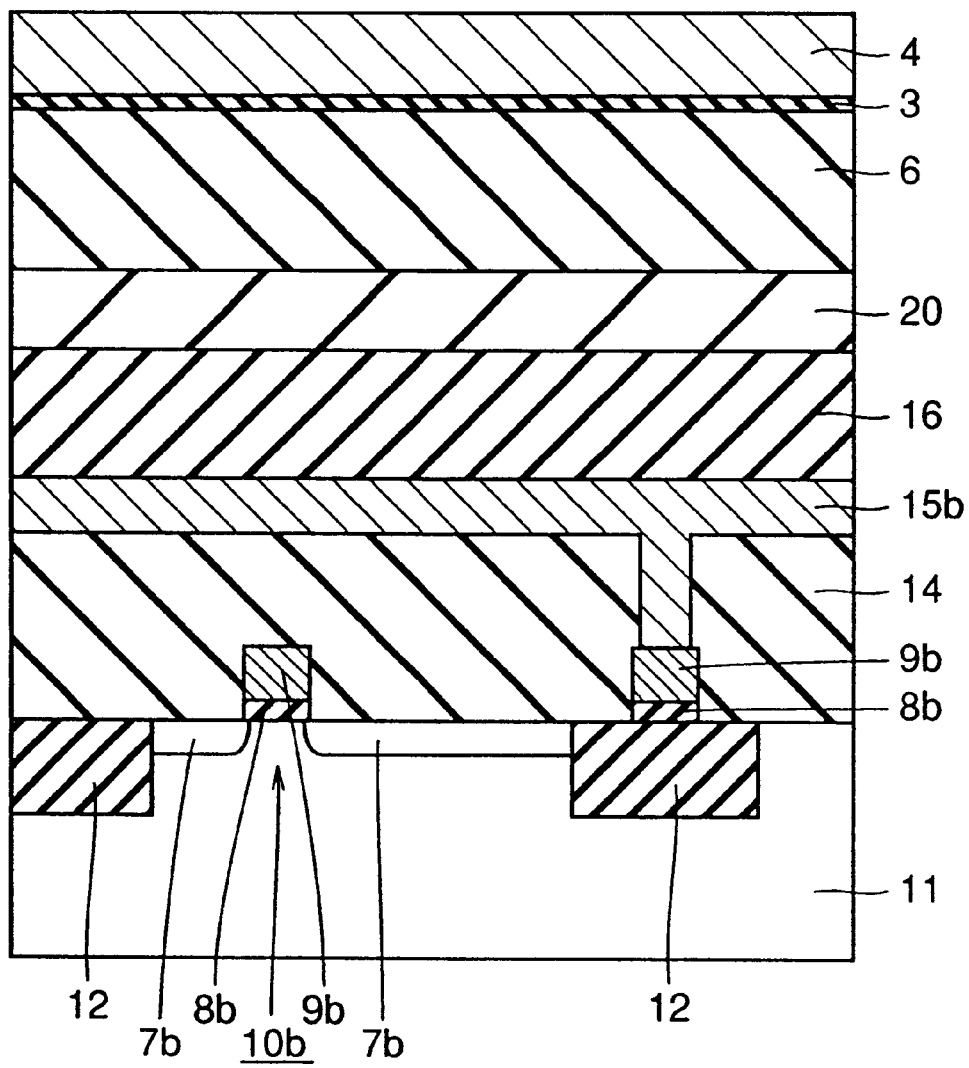

Referring to FIGS. 16, 26 and 36, after capacitor dielectric film 3 is formed, an upper electrode 4 of silicon with an impurity introduced, for example, is formed, thus completing capacitor 5. Most of the capacitor dielectric film 3 and upper electrode 4 formed in the peripheral circuit region are removed by etching.

Thereafter, interlayer insulating layer 21, interconnection layer 22, interlayer insulating layer 23 and so on are formed, and the semiconductor memory device shown in FIGS. 1 to 6 is completed.

The distribution of pores 1a of the lower electrode 1 will be described in the following.

Figure 39:
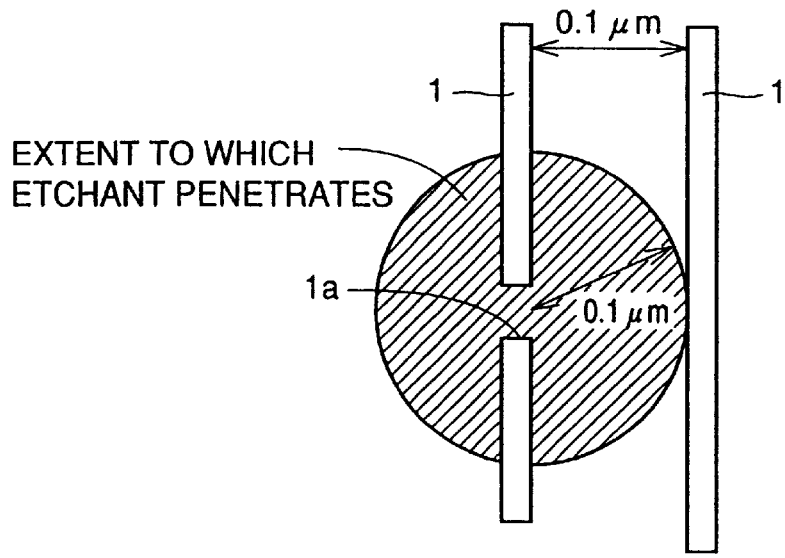
FIG. 39 is an illustration showing the manner how an etchant penetrates from a pore provided in the lower electrode.
Figure 40:
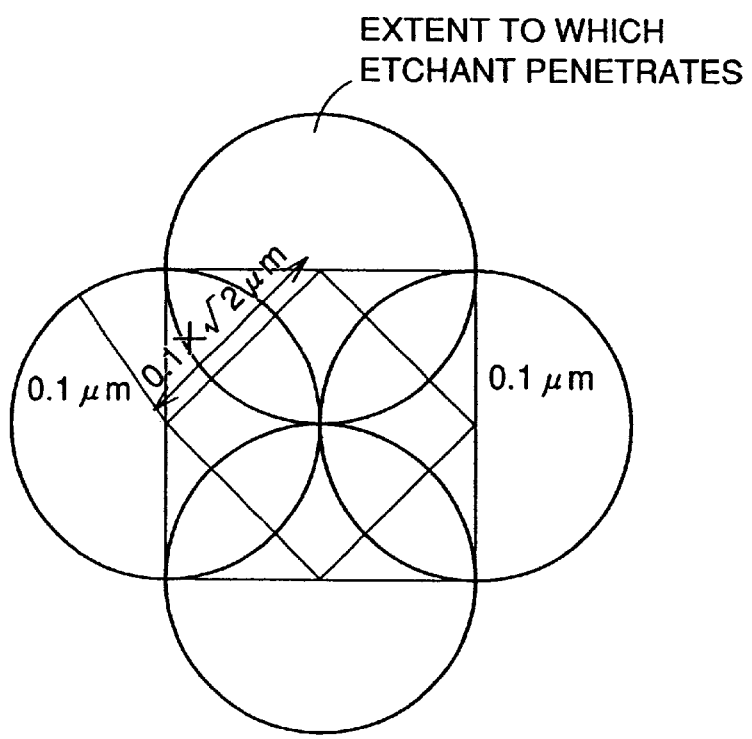
FIG. 40 is an illustration representing an arrangement of the pores enabling entire removal of the insulating layer on the outer peripheral side of the lower electrode.

Referring to FIG. 39, when the dimension between adjacent lower electrodes 1 is 0.1 μm, for example, etching is performed such that the etchant penetrates isotropically by 0.1 μm from the pore 1a provided in lower electrode 1 is performed. In that case, in order to completely remove the insulating layer on the outer peripheral side of lower electrode 1, it is necessary to provide one pore 1a per $0.1 \times \sqrt{2}$ μm=0.141 μm, as shown in FIG. 40.

Figure 41:
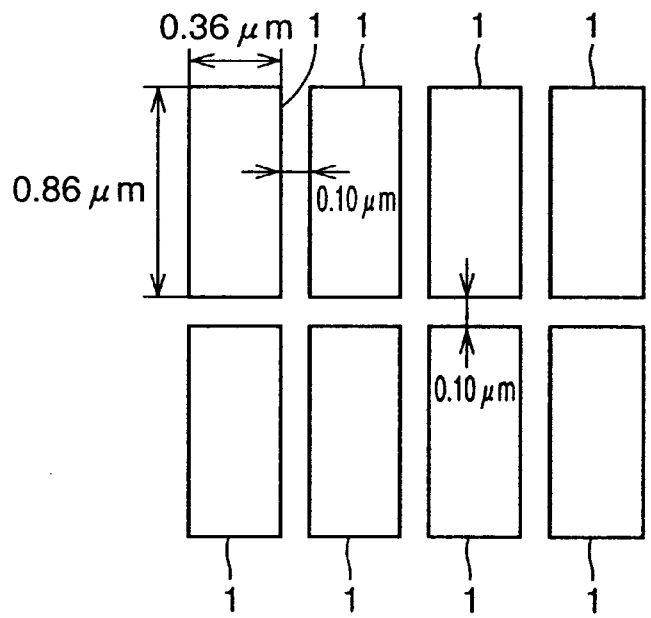
FIG. 41 is a planar layout of a plurality of lower electrodes.

Referring to FIG. 41, when the longitudinal and lateral dimensions of lower electrode 1 is 0.86 μm and 0.36 μm, the outer peripheral length of lower electrode 1 is (0.86+0.36)×2=2.44 μm. As one pore 1a is necessary per 0.141 μm, it means that when there are 17 (=2.44÷0.141) pores 1a along the outer periphery of lower electrode 1, it is possible to completely remove the insulating layer between adjacent lower electrodes 1.

Figure 42:
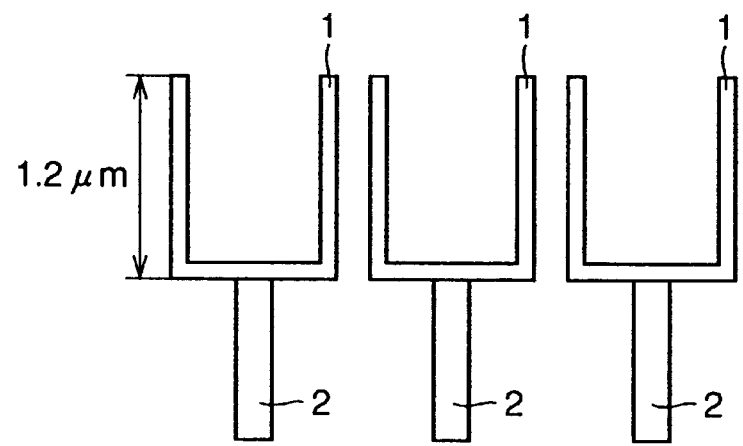
FIG. 42 is an illustration representing the height of the lower electrode.

Referring to FIG. 42, when the height of lower electrode 1 is 1.2 μm, as one pore 1a is necessary per 0.141 μm, if 8.5 (=1.2÷0.141) pores 1a are in the height direction, it is possible to completely remove the insulating layer between adjacent lower electrodes 1.

From the foregoing, the following holds.

When we rerepresent the dimension between adjacent lower electrodes 1 by $L_A$, outer peripheral length of lower electrode 1 by $L_B$ and the height of lower electrode layer 1 by H, it is possible to remove the insulating layer between adjacent lower electrodes 1 entirely if there are at least $L_B/(\sqrt{2} \times L_A)$ pores 1a along the outer periphery of lower electrode 1 and at least $H/(\sqrt{2} \times L_A)$ pores 1a along the height of the lower electrode 1. More specifically, there should be at least $(L_B \times H)/(\sqrt{2} \times L_A)^2$ pores 1a in the overall lower electrode 1.

The condition for heat treatment to provide porous lower electrode layer 1 will be discussed in the following.

Figure 43A:
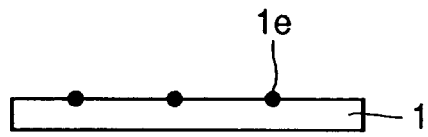
FIGS. 43A to 43D are illustrations showing how the surface roughening proceeds.
Figure 43B:
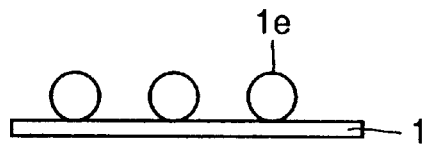
Figure 43C:
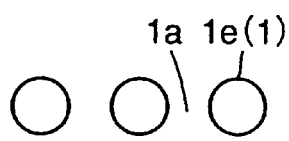
Figure 43D:
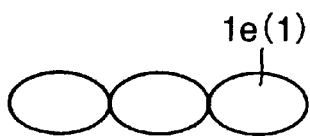

Referring to FIGS. 43A to 43D, when heat treatment is performed, nuclei 1e are formed on a surface of conductive layer 1 formed of doped amorphous silicon (FIG. 43A), and as the nuclei 1e grow, the surface of conductive layer 1 is made rough (FIG. 43B). When nuclei 1e further grow, pores 1a are generated in conductive layer 1 (FIG. 43C). When nuclei 1e grow excessively, nuclei 1e are connected to each other, eliminating the pores (FIG. 43D).

Figure 44:
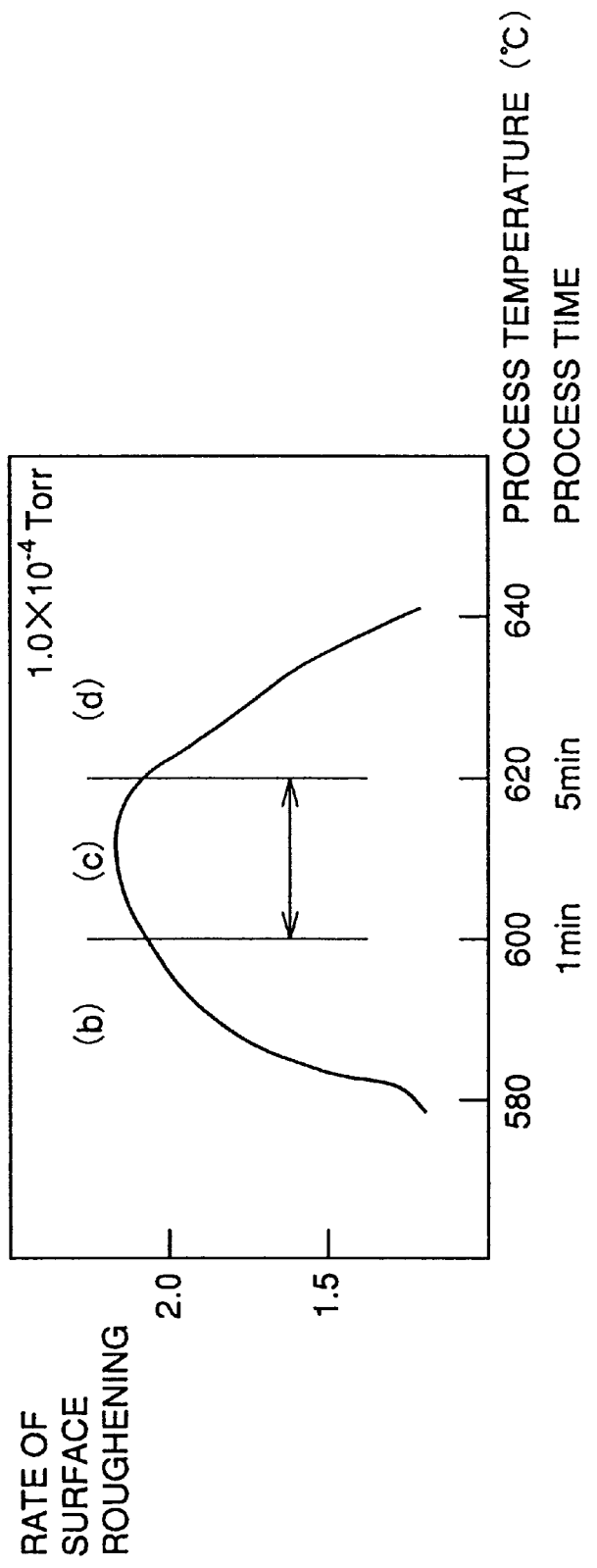
FIG. 44 is a graph representing relation between heat treatment condition and the surface roughening rate.
Figure 45:
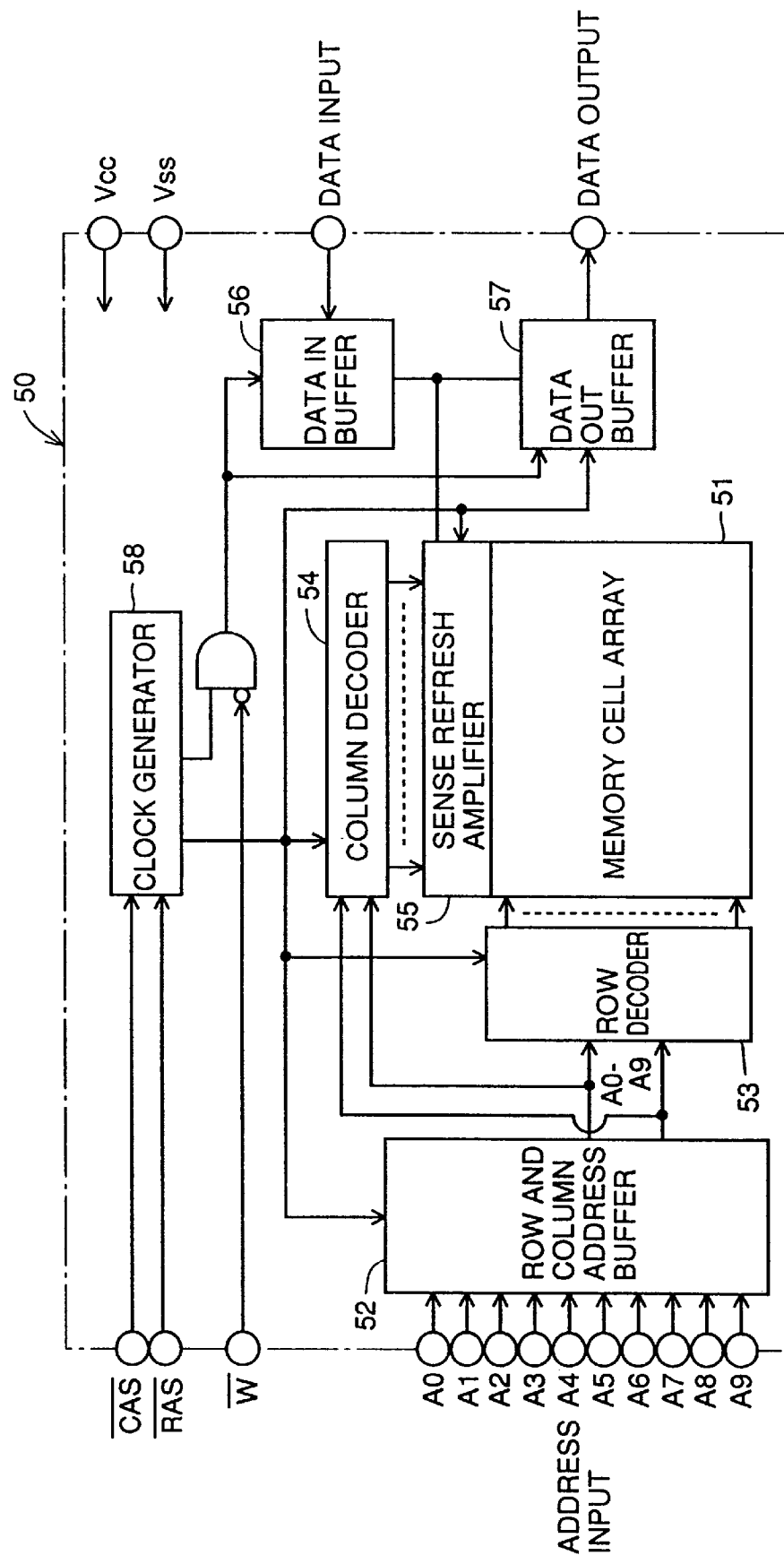
FIG. 45 is a block diagram of a general DRAM.
Figure 46:
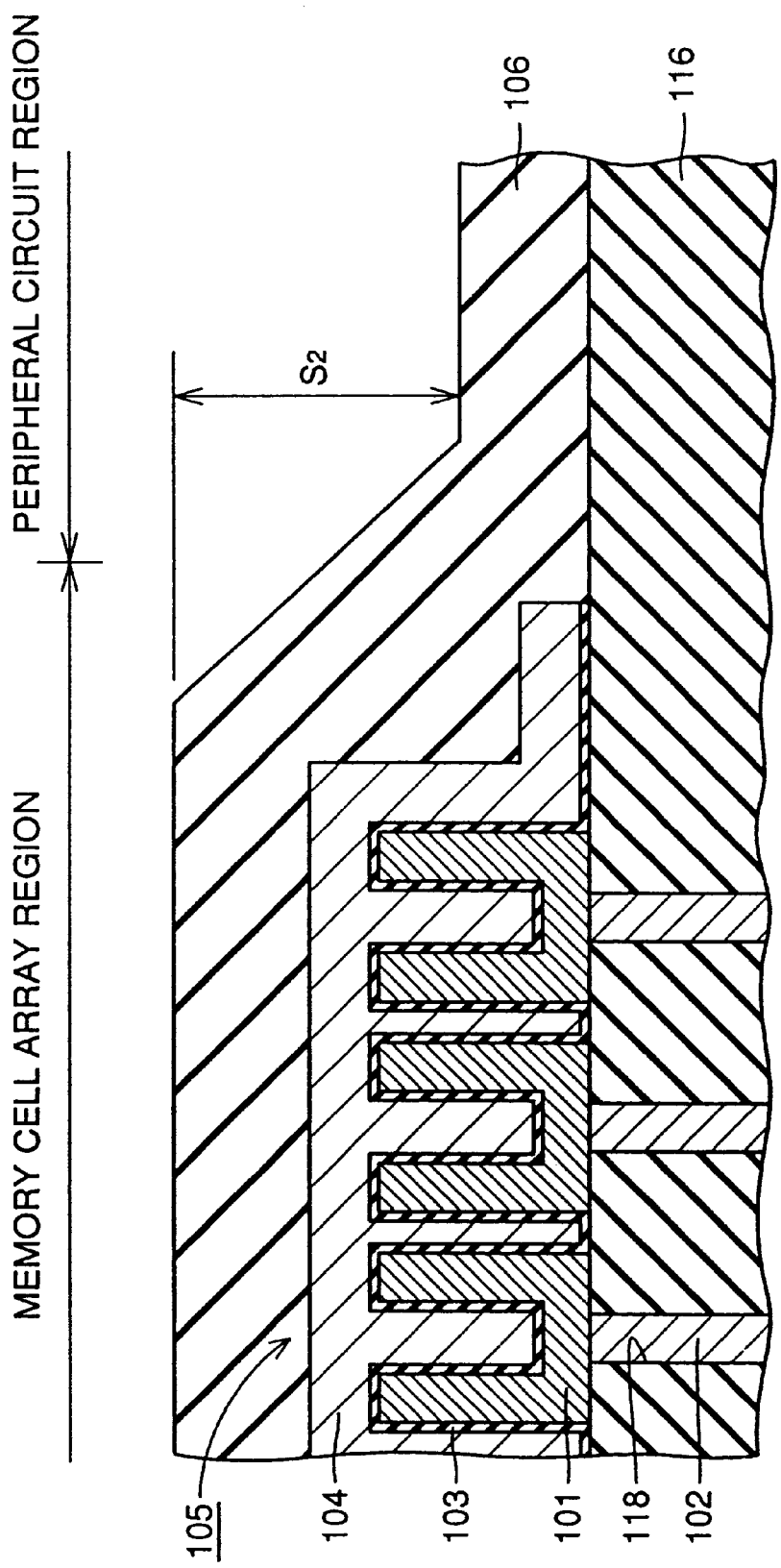
FIG. 46 is a schematic cross section showing a structure of a conventional semiconductor memory device.

The relation between the progress of roughening of the surface and the condition of heat treatment was studied, the result of which is shown in FIG. 44. More specifically, when the temperature of heat treatment was 600° C. to 620° C. and the time of heat treatment was 1 minute to 5 minutes, pores 1a were formed successfully as shown in FIG. 43C with the rate of surface roughness of at least 2.0. By contrast, when the temperature of heat treatment was lower than 600° C. or the time of heat treatment was shorter than 1 minute, progress of surface roughening was not sufficient as shown in FIG. 43B, and pores were not yet formed. When the heat treatment temperature was higher than 620° C. or the time of heat treatment exceeded 5 minutes, nuclei growth was excessive, so that the pores were eliminated, as shown in FIG. 43D.

Therefore, preferable condition of heat treatment to make the layer porous and rough is the heat treatment temperature of 600° C. to 620° C. and the time of 1 minute to 5 minutes.

In the present embodiment, insulating layers 6 and 20 for making less steep the step is formed in the peripheral circuit region, and therefore the step $S_1$ between the memory cell array region and the peripheral circuit region can be made less steep. More specifically, the step $S_1$ approximately corresponds to the sum of the thickness of upper electrode 4 and capacitor dielectric film 3. As the step $S_1$ between the memory cell array region and the peripheral circuit region can be made less steep as compared with the prior art, residue is less likely be left at the step when the conductive layer 22 is patterned on insulating layer 21, and therefore degradation in process margin of the subsequent manufacturing steps can be suppressed.

Further, by the process step of FIGS. 14 (FIG. 24) to 15 (FIG. 25), the etchant entering the opening 6a for the lower electrode reaches the outer peripheral side through the pores 1a of the lower electrode 1, whereby insulating layers 20 and 6 on the outer peripheral side of lower electrode 1 can be removed by etching. More specifically, insulating layers 20 and 6 on the outer peripheral side of lower electrode 1 are removed by lateral etching from the inner peripheral side to the outer peripheral side. Therefore, etching of only the desired width to be removed of insulating layers 20 and 6 on the outer peripheral side of lower electrode 1 is necessary, and etching by the vertical height of lower electrode 1 is unnecessary. Therefore, reduction in film thickness in the vertical direction by the etching can be suppressed, and therefore, at the time of this etching, it is unnecessary to provide any mask on insulating layer 6 in the peripheral circuit region. Therefore, it becomes possible to remove insulating layers 20 and 6 between adjacent lower electrodes 1 by the etching in self-alignment manner.

Further, as insulating layers 20 and 6 on the outer peripheral side of lower electrode 1 can be removed, the outer peripheral side of lower electrode 1 can also be utilized as a capacitor, and hence capacitance is increased.

Though a DRAM has been described above, the present invention is similarly applicable to a semiconductor device including both a DRAM and a logic such as an eRAM (embedded DRAM). Further, the present invention is also applicable to any semiconductor device which includes a DRAM.

Further, though the present invention has been applied to a COB (Capacitor over Bitline) structure of a stacked type cell in the foregoing, the present invention is not limited thereto.

Further, insulating layers 6 and 20 may be formed of different materials.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor memory device having a memory cell array region including a plurality of memory cells and a peripheral circuit region including an element for controlling said memory cells, comprising the steps of:

forming an insulating layer both in said memory cell array region and said peripheral circuit region and having an opening in said memory cell array region;

forming a conductive layer having a porous cylindrical portion along an inner wall surface of said opening; and removing said insulating layer positioned on an outer peripheral side of said cylindrical portion by etching, by introducing an etchant from an inner peripheral region to an outer peripheral region of said cylindrical portion through pores in said conductive layer.

2. The method of manufacturing a semiconductor memory device according to claim 1, wherein said removal by etching is effected by isotropic etching.

3. The method of manufacturing a semiconductor memory device according to claim 1, further comprising the step of forming another electrode opposing both to the inner peripheral surface and the outer peripheral surface of said cylindrical portion with a dielectric film interposed.

4. The method of manufacturing a semiconductor memory device according to claim 1, wherein said step of forming a conductive layer having a porous cylindrical portion includes the steps of forming the porous conductive layer on an upper surface of said insulating layer and on the inner wall surface of said opening, forming a resist only at a bottom portion of said opening, and by anisotropically etching said conductive layer with said resist left, removing said conductive layer on the upper surface of said insulating layer and leaving said conductive layer in said opening.

5. The method of manufacturing a semiconductor memory device according to claim 4, wherein said step of forming a resist only at the bottom portion of said opening includes the steps of applying said resist of positive type to an entire surface, exposing a relatively shallow portion from an upper surface of said resist to such an extent that enables removal by development, and exposing a relatively deep portion to such an extent that does not allow removal by development, and developing exposed said resist.

6. The method of manufacturing a semiconductor memory device according to claim 4, wherein said step of forming the resist only at the bottom portion of said opening includes the steps of applying said resist to an entire surface, and developing said resist such that only a relatively shallow portion from an upper surface of said resist is removed and a relatively deep portion is left.

7. The method of manufacturing a semiconductor memory device according to claim 1, wherein said step of forming a porous conductive layer includes, after said conductive layer is formed, the step of performing heat treatment for making the conductive layer porous and surface roughening under condition of a temperature of 600° C. to 620° C. for a time period of 1 minute to 5 minutes.

* * * * *